(12) United States Patent  
Uchiyama

(10) Patent No.: US 7,675,110 B2  
(45) Date of Patent: Mar. 9, 2010

(54) SEMICONDUCTOR DEVICE AND METHOD OF MANUFACTURING THE SAME

(75) Inventor: Hiroyuki Uchiyama, Tokyo (JP)

(73) Assignee: Elpida Memory, Inc., Tokyo (JP)

( * ) Notice: Subject to any disclaimer, the term of this patent is extended or adjusted under 35 U.S.C. 154(b) by 876 days.

(21) Appl. No.: 11/264,092

(22) Filed: Nov. 2, 2005

(65) Prior Publication Data

US 2006/0097314 A1    May 11, 2006

(30) Foreign Application Priority Data

Nov. 8, 2004    (JP)    ............................. 2004-323122

(51) Int. Cl.  
 *H01L 21/336* (2006.01)
(52) U.S. Cl. ................ 257/330; 438/270; 257/E29.201
(58) Field of Classification Search .................. 257/330  
See application file for complete search history.

(56) References Cited

U.S. PATENT DOCUMENTS

| | | | | |
|---|---|---|---|---|
| 6,252,277 | B1 * | 6/2001 | Chan et al. | ................... 257/330 |
| 7,109,552 | B2 * | 9/2006 | Wu | ............................. 257/335 |
| 7,361,537 | B2 * | 4/2008 | Park | .......................... 438/196 |
| 2002/0011613 | A1 * | 1/2002 | Yagishita et al. | ............. 257/284 |
| 2003/0057487 | A1 * | 3/2003 | Yamada et al. | .............. 257/347 |

FOREIGN PATENT DOCUMENTS

| | | | |
|---|---|---|---|
| JP | 07-066297 | | 3/1995 |
| JP | 2002-043544 | | 2/2002 |
| JP | 2002-110930 | | 4/2002 |
| KR | 10-2001-0078941 | * | 6/2003 |

* cited by examiner

*Primary Examiner*—Thao X Le  
*Assistant Examiner*—Kimberly Trice  
(74) *Attorney, Agent, or Firm*—McDermott Will & Emery LLP

(57) ABSTRACT

After an element isolation region is formed using a field-forming silicon nitride film, the silicon nitride film and a semiconductor substrate are patterned. Thereafter, the silicon nitride film and the semiconductor substrate are patterned, thereby forming a gate trench reaching the semiconductor substrate in an active region. Next, after a gate electrode is formed within a gate trench, the silicon nitride film is removed, thereby forming a contact hole. A contact plug is buried into this contact hole. Accordingly, a diffusion layer contact pattern becomes unnecessary, and the active region can be reduced. Because a gate electrode is buried in the gate trench, a gate length is increased, and a sub-threshold current can be reduced.

14 Claims, 26 Drawing Sheets

SEMICONDUCTOR DEVICE AND METHOD OF MANUFACTURING THE SAME

TECHNICAL FIELD

The present invention relates to a semiconductor device, and more particularly relates to a semiconductor device having a MOS transistor formed on an active region. The invention also relates to a method of manufacturing a semiconductor device, and more particularly relates to a method of forming a MOS transistor in an active region.

BACKGROUND OF THE INVENTION

Conventionally, the following method of manufacturing a MOS transistor on a semiconductor substrate is generally used. First, an isolation region is formed on the semiconductor substrate using a field-forming insulation film as a mask. The field-forming insulation film is then detached to expose the active region, and a conductive film is deposited on the exposed region. The conductive film is patterned to form a gate electrode. A sidewall is formed on a side surface of the gate electrode, and a contact plug to be connected to a source/drain diffusion region is formed, thereby completing the MOS transistor.

However, according to the conventional method, three mask patterns are necessary including a mask pattern to form a field-forming insulation film (an active field pattern), a mask pattern to form a gate electrode (a gate electrode pattern), and a mask pattern to form a contact plug (a diffusion contact pattern). A part of these three mask patterns cannot be omitted. Therefore, manufacturing cost cannot be reduced by reducing steps of manufacturing process. Furthermore, a positional mismatch between the contact plug and the active region needs to be considered at the time of forming the contact plug using the mask pattern (the diffusion layer contact pattern). Consequently, a wide active region needs to be secured by taking into account a margin for forming the contact plug, and it is difficult to reduce the area of the active region.

Furthermore, in order to form a lightly doped drain (LDD) region and a self-aligned contact, a cap insulation film is necessary on the gate electrode. In this case, a total film thickness of films including the gate electrode becomes about two times the thickness of the gate electrode, which results in a very high aspect ratio. Consequently, a processing margin becomes short in patterning the gate electrode. A margin of burying various kinds of materials in a space between gate electrodes such as a sidewall and a contact plug, and a processing margin of an interlayer insulation film that is once buried into a space between the gate electrodes and then removed become short. This problem is particularly evident in a transistor having a large film thickness of a gate electrode and a very small distance between the gate electrodes due to the employment of a polymetal structure such as a memory cell transistor of a dynamic random access memory (DRAM).

The problem of the very high aspect ratio can be solved somewhat by using a damascene process in the manufacturing of a memory cell of the DRAM, as described in Japanese patent application laid open No. 2002-43544 and Japanese patent application laid open No. 2002-110930. According to the damascene process, an inter-gate insulation film is formed before the gate electrode. Therefore, a defect due to a shortage in a covering rate of the inter-gate insulation film (a short-circuiting between contacts) can be prevented. However, in this case, it is difficult to substantially reduce steps of the photolithography process or substantially reduce the active region.

When a transistor size becomes small due to miniaturization of the transistor, a sub-threshold current increases based on what is called the "short-channel effect". Accordingly, a refresh characteristic reduces in the DRAM, for example. In order to solve this problem, it is effective to secure a sufficient gate length while suppressing the area per one transistor by burying a gate electrode within a trench formed on a semiconductor substrate (see Japanese patent No. 3,150,496).

However, in order to embed a gate electrode into the trench, a mask pattern to form the trench on the semiconductor substrate is separately necessary. Therefore, it is also difficult to reduce steps of a photolithography process and to substantially reduce an active region.

SUMMARY OF THE INVENTION

The present invention has been achieved to solve the above problems. It is an object of the invention to provide a semiconductor device and a manufacturing method thereof that can reduce steps of a photolithography process.

It is another object of the present invention to provide a semiconductor device and a manufacturing method thereof that can increase an integration degree by reducing an active region.

It is still another object of the present invention to provide a semiconductor device and a manufacturing method thereof that can facilitate forming of gate electrode materials and various kinds of materials to be formed between gate electrodes.

It is still another object of the present invention to provide a semiconductor device capable of suppressing a sub-threshold current due to a short-channel effect, and a method of manufacturing the semiconductor device.

The above and other objects of the present invention can be accomplished by a semiconductor device, comprising: an active region that is surrounded by an isolation region having source/drain diffusion regions and a gate trench formed between the source/drain diffusion regions; a gate electrode at least a part of which is buried in the gate trench; and contact plugs connected to the source/drain diffusion regions, wherein a periphery of the contact plugs at the isolation region side substantially coincides with a boundary between the isolation region and the active region.

According to the present invention, an active region is not substantially present at the outside of the periphery of a contact plug. Therefore, a semiconductor device can be highly integrated by reducing the active region. Furthermore, because a gate electrode is buried in a gate trench, the surrounding of the gate trench is used as a channel region. Thus, a gate length is increased without reducing the integration degree. A sub-threshold current due to the short-channel effect can therefore be reduced.

The above and other objects of the present invention can be also accomplished by a method of manufacturing a semiconductor device, comprising: a first step for forming a field-forming insulation film having a predetermined pattern on a semiconductor substrate; a second step for forming an isolation region using the field-forming insulation film; a third step for forming a gate trench on the semiconductor substrate by patterning the field-forming insulation film and the semiconductor substrate; a fourth step for burying at least a gate electrode into the gate trench; a fifth step for forming a contact hole by removing the field-forming insulation film; and a sixth step for burying a contact plug into the contact hole.

According to the present invention, a gate electrode and a contact plug are formed by using a field-forming insulation film. Therefore, a contact plug can be formed in self alignment in the active region. Accordingly, the contact plug can be formed without using different mask pattern (a diffusion layer contact pattern). Consequently, the number of steps of the photolithography process can be reduced. Because an aspect ratio of a gate trench and a contact hole can be reduced, various kinds of materials constituting a gate electrode and various kinds of materials constituting a contact plug can be buried easily.

It is preferable that the second step of manufacturing a semiconductor device according to the present invention includes a first sub-step for forming an isolation trench on the semiconductor substrate using the field-forming insulation film as a mask, and a second step for burying a dielectric material into the isolation trench. Based on this arrangement, the isolation region becomes in an STI structure, and can obtain high flatness. Accordingly, a gate trench can be formed easily.

After performing the fifth step and before performing the sixth step, it is preferable that ion-implantation is performed in substantially a vertical direction thereby forming a source/drain diffusion region and that ion-implantation is preformed in a diagonal direction thereby forming an LDD region.

Particularly, it is preferable that a source/drain diffusion region is formed in a memory cell region by performing ion-implantation in substantially a vertical direction, that an LDD region is formed in the memory cell region by performing ion-implantation at a first angle from a diagonal direction, that a source/drain diffusion region is formed in a peripheral circuit region by performing ion-implantation at a second angle larger than the first angle from a diagonal direction, and that an LDD region is formed in the peripheral circuit region by performing ion-implantation at a third angle larger than the second angle from a diagonal direction.

According to this arrangement, a source/drain diffusion region and an LDD region can be formed in self alignment without using a mask (or by using a common mask), instead of individually carrying out ion-implantation by using a mask into a memory cell region having a relatively small width of a contact hole and into a peripheral circuit region having a relatively large contact hole.

BRIEF DESCRIPTION OF THE DRAWINGS

The above and other objects, features and advantages of this invention will become more apparent by reference to the following detailed description of the invention taken in conjunction with the accompanying drawings, wherein.

DETAILED DESCRIPTION OF THE EMBODIMENTS

Preferred embodiments of the present invention will now be explained with reference to the accompanying drawings, using a DRAM as an example.

A surface of the DRAM is divided into a "memory cell region" where a lot of memory cells are disposed and a "peripheral circuit region" where peripheral circuits such as a decoder circuit are disposed. According to this embodiment, a transistor in the memory cell region (a memory cell transistor) and a transistor in the peripheral circuit region are formed simultaneously using the same method. Therefore, in each of the following cross-sectional diagrams (such as FIG. 1) used for the explanation, a partial cross section of a memory cell region M is shown on the left side, and a partial cross section of a peripheral circuit region P is shown on the right side.

A first embodiment of the present invention now will be explained.

Figure 1:
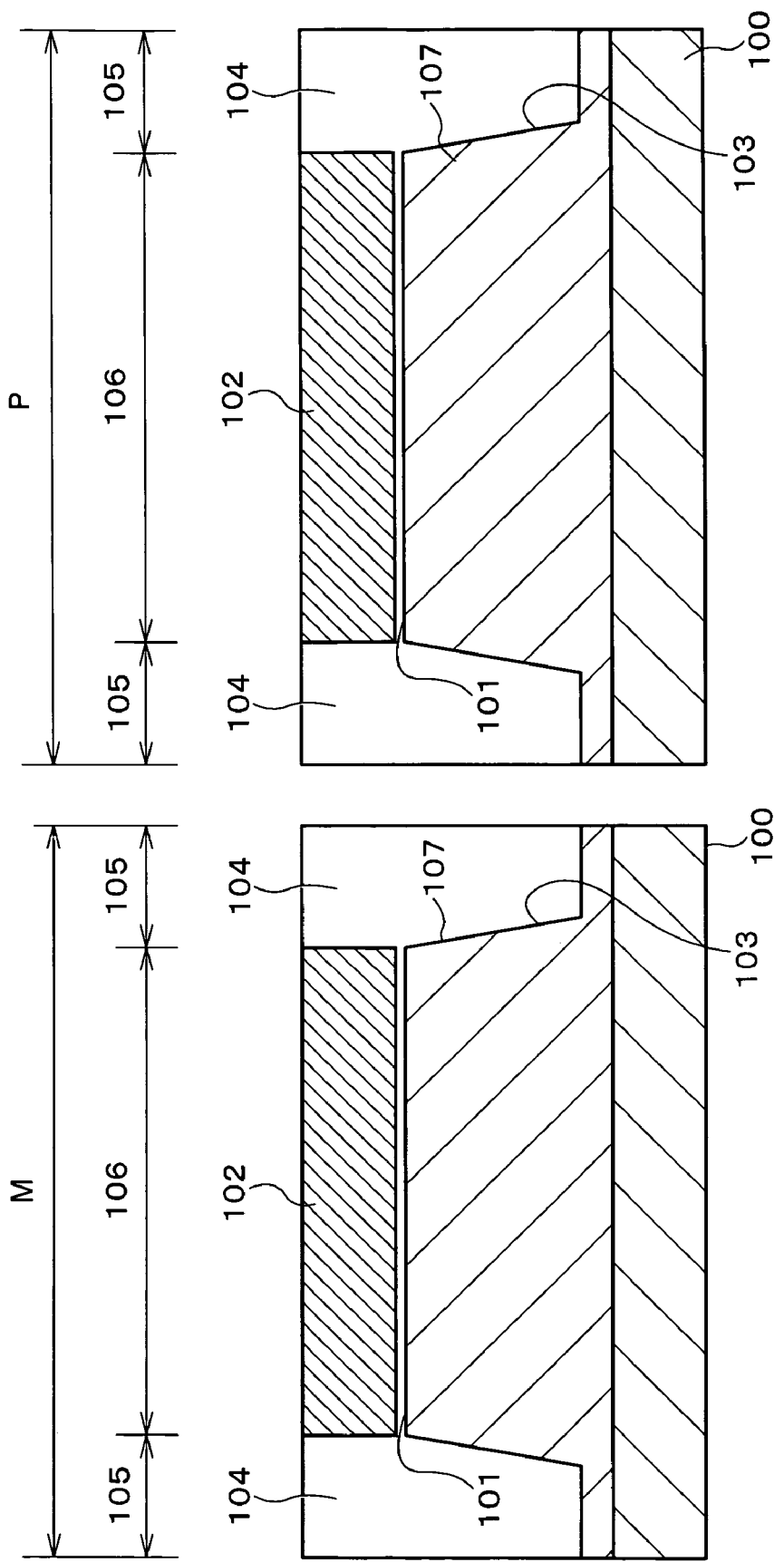
FIG. 1 is a partial cross-sectional diagram showing one process (a formation of a silicon oxide film 101 to a formation of a p-type well region 107) of a method of manufacturing a semiconductor device according to a first embodiment of the present invention.

First, as shown in FIG. 1, a silicon oxide film 101 is formed on the surface of a semiconductor substrate 100 by thermal oxidation. Then, a silicon nitride film 102 is formed on the silicon oxide film 101 by chemical vapor deposition (CVD). The silicon nitride film 102 excluding a part of the film that becomes an active region is then removed. Accordingly, only the part of the surface of the semiconductor substrate 100 that becomes the active region is covered with the silicon nitride film 102. The silicon nitride film 102 patterned in this way is used as a "field-forming insulation film" that forms an isolation region.

Next, the silicon oxide film 101 and the semiconductor substrate 100 are etched using the silicon nitride film 102 that works as the field-forming insulation film as a mask, thereby forming an element isolation trench 103 having a depth of about 350 nm. The semiconductor substrate 100 is then thermally oxidized at about 1,000° C., thereby forming a thin silicon oxide (not shown) having a film thickness of about 10 nm on the inner wall of the isolation trench 103. A silicon oxide film 104 is then deposited in the film thickness of 450 to 500 nm by CVD. Accordingly, the isolation trench 103 is filled by the silicon oxide film 104. The silicon oxide film 104 is polished by chemical mechanical polishing (CMP) until when the upper surface of the silicon nitride film 102 is exposed, and both upper surfaces are flattened, thereby completing an isolation region 105. The isolation region 105 having a trench structure like this is generally called a shallow trench isolation (STI) region. The region of the semiconductor substrate 100 surrounded with the isolation region 105 becomes an active region 106.

Next, impurity such as boron (B) is ion-implanted into the active region 106 via the silicon nitride film 102, thereby forming a p-type well region 107 in the active region 106. When a circuit in a CMOS structure is to be formed in the peripheral circuit region P, impurity such as phosphor (P) and arsenic (As) is ion-implanted in a state that the region in which an N-type MOS transistor is to be formed is masked, thereby forming an n-type well region (a deep n well region). Impurity such as boron (B) is then ion-implanted without using a mask, thereby forming a p-type well region 107.

Figure 2:
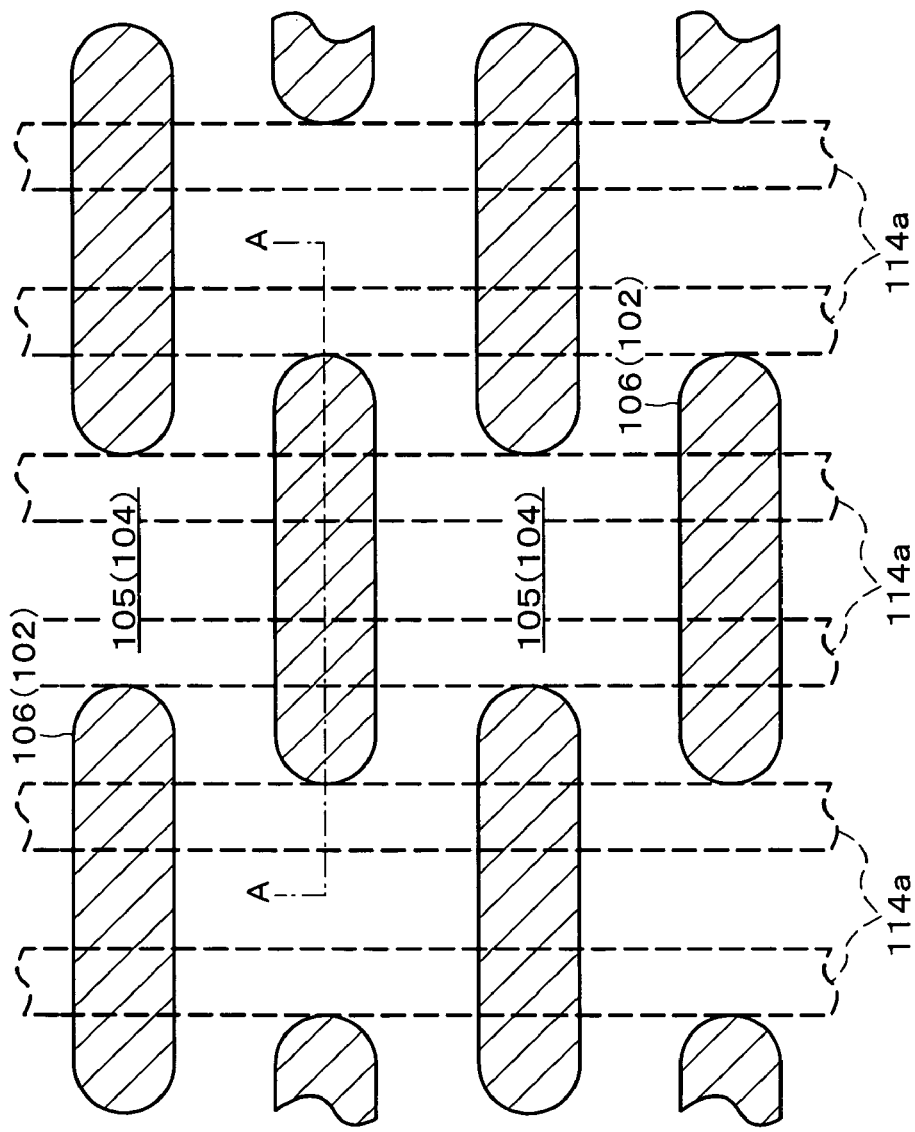
FIG. 2 is a partial top plan view of a pattern shape of the memory cell region M in which the process shown in FIG. 1 is completed.

FIG. 2 is a partial top plan view of a pattern shape of the memory cell region M in which the above process is completed. A cross section along a line A-A in FIG. 2 corresponds to the cross section of the memory region M shown in FIG. 1. As shown in FIG. 2, when the above process is completed, plural active regions 106 encircled by the isolation region 105 are regularly disposed in the memory cell region M. As described above, at this stage, each active region 106 is covered with the silicon nitride film 102 as the field-forming insulation film.

Figure 3:
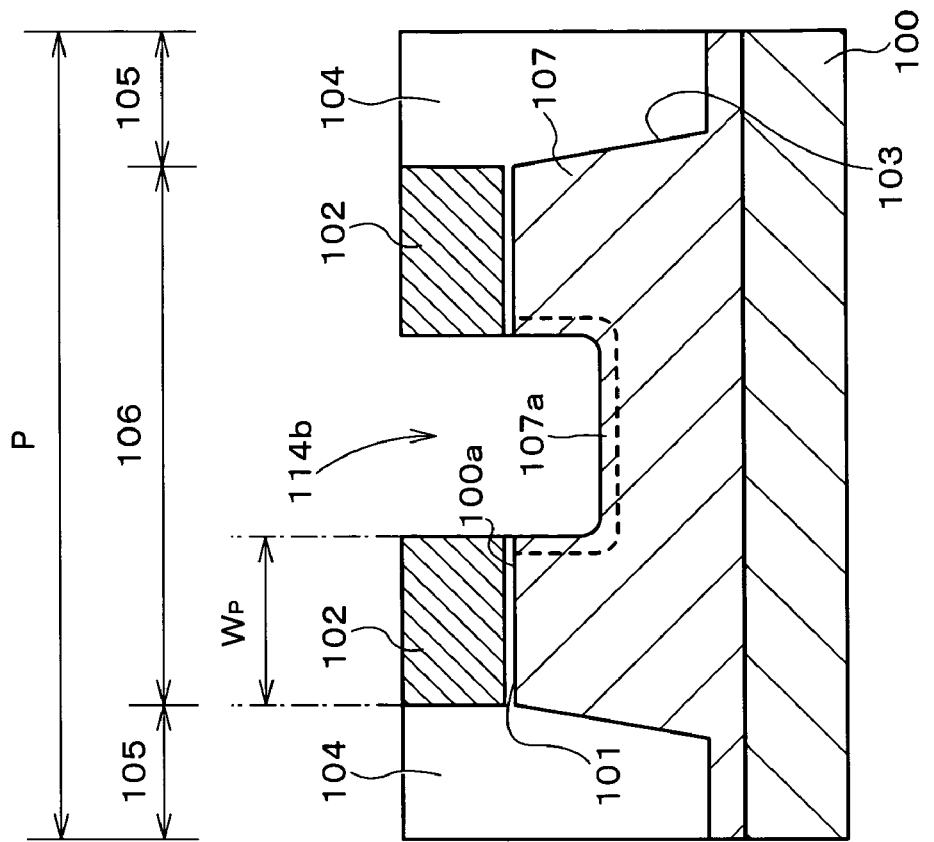
FIG. 3 is a partial cross-sectional diagram showing one process (a formation of a gate trench 114b) of the method of manufacturing a semiconductor device according to a first embodiment of the present invention.
Figure 3:
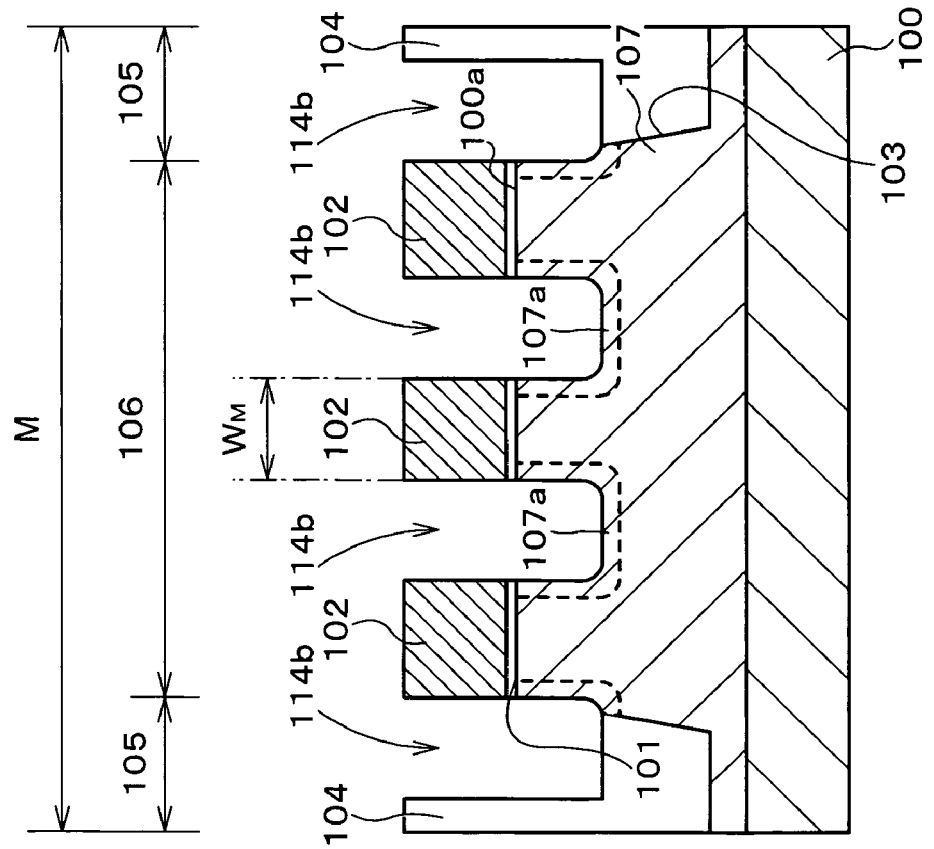

Next, the silicon nitride film 102 and the silicon oxide film 104 that are present in a region 114a in which a gate electrode is to be formed are removed using a mask pattern (a gate electrode pattern, not shown). Accordingly, a gate trench 114b as shown in FIG. 3 is formed on the semiconductor substrate 100. While there is no particular limit to the depth of the gate trench 114b, preferably, the gate trench 114b is set to have a depth of about 40 to 60 nm based on a main surface 100a of the semiconductor substrate 100. Preferably, a width $W_M$ of the silicon nitride film 102 that is to be left in the memory cell region M and a width $M_P$ of the silicon nitride film 102 that is to be left in the peripheral circuit region P have a relationship of $W_M < W_P$, for reasons to be described later.

Next, impurity such as boron (B) is ion-implanted from a diagonal direction according to need, thereby carrying out channel doping in the channel region 107a. When the channel doping in the channel region 107a is to be carried out individually in the memory cell region M and the peripheral circuit region P, ion-implantation is carried out in each region with the other region masked.

Figure 4:
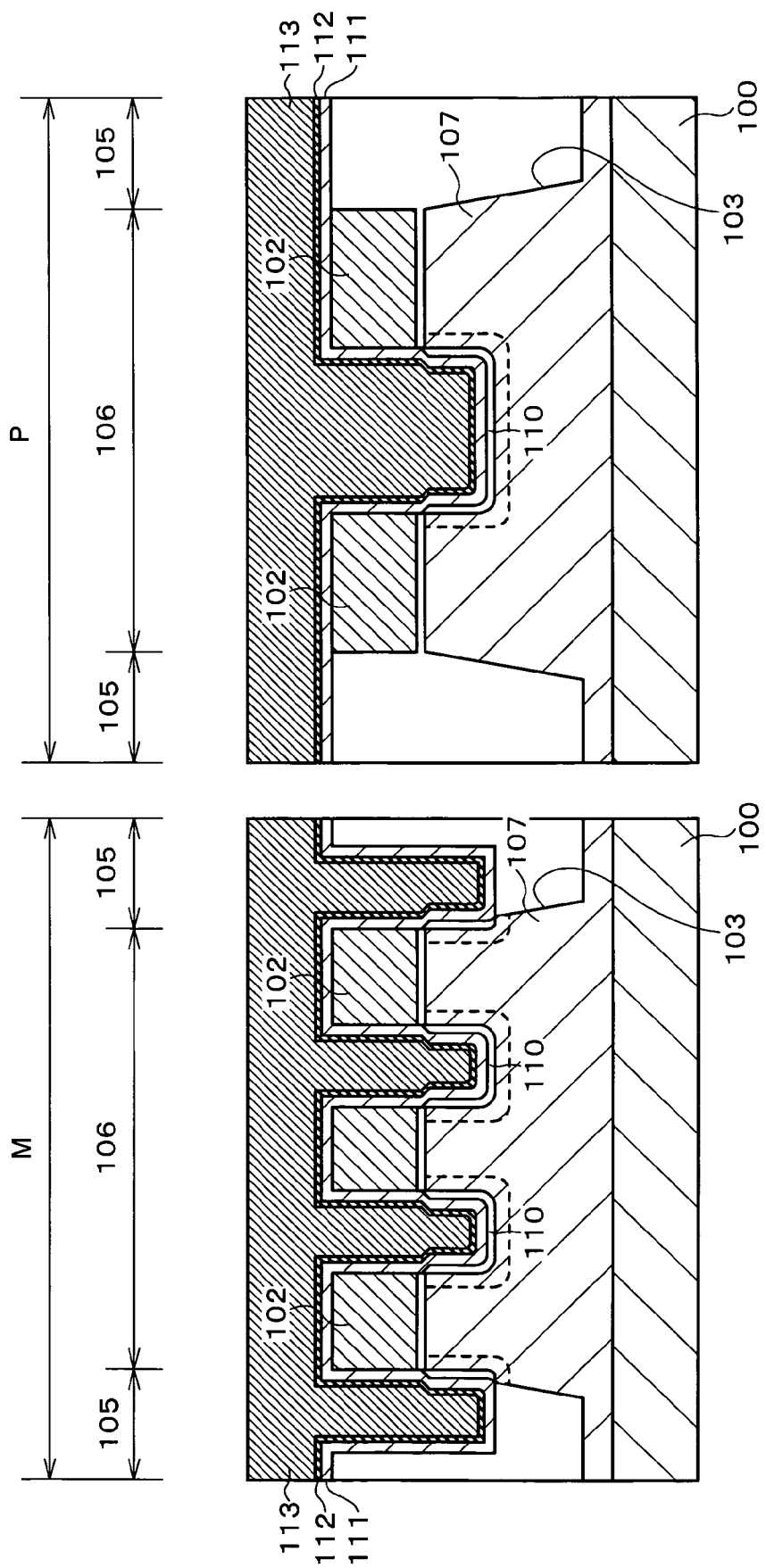
FIG. 4 is a partial cross-sectional diagram showing one process (a formation of a polycrystalline silicon film 111, a tungsten nitride film 112, and a tungsten film 113) of the method of manufacturing a semiconductor device according to a first embodiment of the present invention.

Next, as shown in FIG. 4, a gate insulation film 110 having a film thickness of about 6 to 7 nm is formed on the surface of the gate trench 114b by thermal oxidation. Thereafter, a polycrystalline silicon film 111 doped with impurity of phosphor (P) or the like, a tungsten nitride (WNx) film 112, and a tungsten film (W) 113 are sequentially deposited. The polycrystalline silicon film 111 can be formed by chemical vapor deposition (CVD). The polycrystalline silicon film 111 needs to be set in a small thickness so as to avoid the gate trench 114b from completely filled. For example, when a depth and a width of the gate trench 114b in the memory cell region M are 200 nm and 100 nm, respectively, the polycrystalline silicon film 111 is set to have a film thickness of about 20 to 30 nm. The tungsten nitride film 112 and the tungsten film 113 can be formed by CVD. Like the polycrystalline silicon film 111, the tungsten nitride film 112 also needs to have a sufficiently small thickness so as to avoid the gate trench 114b from completely filled. Because the tungsten nitride film 112 is used as a barrier layer, 5 to 10 nm is sufficient as a film thickness of the tungsten nitride film 112. On the other hand, the tungsten film 113 needs to have a sufficiently large thickness to completely fill at least the gate trench 114b.

Figure 5:
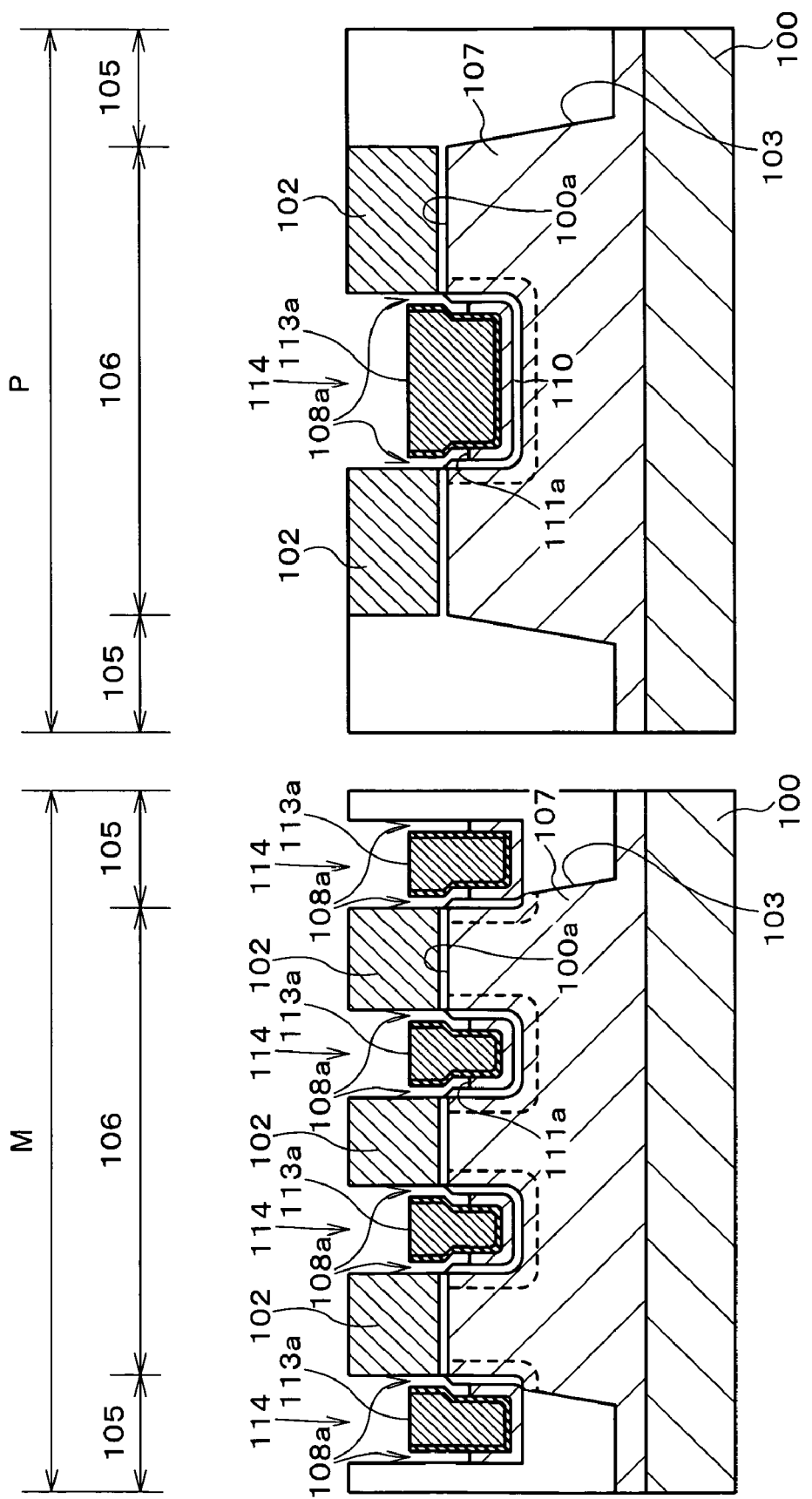
FIG. 5 is a partial cross-sectional diagram showing one process (a formation of a gate electrode 114) of the method of manufacturing a semiconductor device according to a first embodiment of the present invention.

Next, as shown in FIG. 5, the tungsten film 113 and the tungsten nitride film 112 are etched back, and further, the polycrystalline silicon film 111 is etched back. These films need to be etched back so that the upper surface (an etching end surface) 113a of the tungsten film 113 is set lower than the upper surface of the silicon nitride film 102 that is the field-forming insulation film, and that the upper surface (an etching end surface) 111a of the polycrystalline silicon film 111 is set lower than the main surface 100a of the semiconductor substrate 100. The reason that the upper surface 113a of the tungsten film 113 is set lower than the upper surface of the silicon nitride film 102 is in order to form a cap as described later. The reason that the upper surface 111a of the polycrystalline silicon film 111 is set lower than the main surface 100a of the semiconductor substrate 100 is in order to secure insulation between a gate electrode 114 and a contact plug (120) described later.

Particularly, it is preferable that the upper surface 113a of the tungsten film 113 is set higher than the upper surface 111a of the polycrystalline silicon film 111 (see FIG. 5). With this arrangement, a gap 108a is formed between the silicon nitride film 102 and the tungsten film 113. In order to form this gap 108a, the polycrystalline silicon film 111 needs to be isotropically etched back by a method that makes it possible to secure high selectivity of the tungsten film 113 and the tungsten nitride film 112, like wet etching using hydrofluoric acid (HF) plus nitric acid ($HNO_3$). A gap between the upper surface of the silicon nitride film 102 and the upper surface 113a of the tungsten film 113 is set so that processing (polishing) margin of a cap described later can be absorbed. For example, when a polishing variation is a maximum about 50 nm, the gap is set to be within 80 nm to 120 nm. Thus, the gate electrode 114 is embedded into the gate trench 114b.

The etch-back amount of the tungsten film 113 depends on a required gate resistance. Therefore, when the gate trench 114b has a sufficiently large depth, the etching end surface 113a of the tungsten film 113 and the etching end surface 111a of the polycrystalline silicon film 111 can be set become substantially the same plane.

Figure 6:
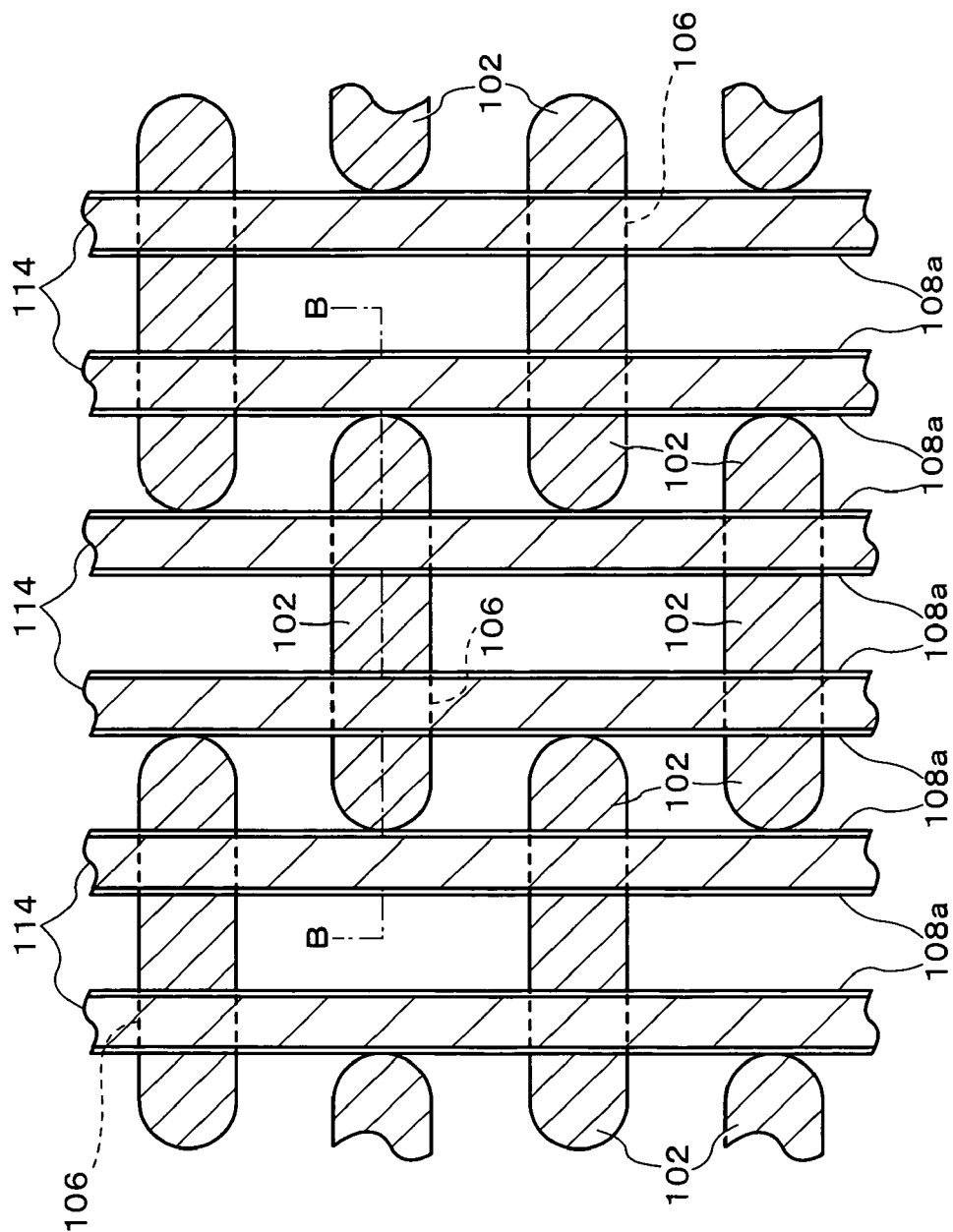
FIG. 6 is a partial top plan view of a pattern shape of the memory cell region M in which the process shown in FIG. 5 is completed.

FIG. 6 is a partial top plan view showing a pattern shape of the memory cell region M in which the above process is completed. A cross section along a line B-B in FIG. 6 corresponds to the cross section of the memory cell region M shown in FIG. 5. As shown in FIG. 6, upon completing the above process, the active region 106 is configured by a part covered with the silicon nitride film 102 and the gate electrode 114. The gaps 108a are formed at both sides of the gate electrode 114.

Figure 7:
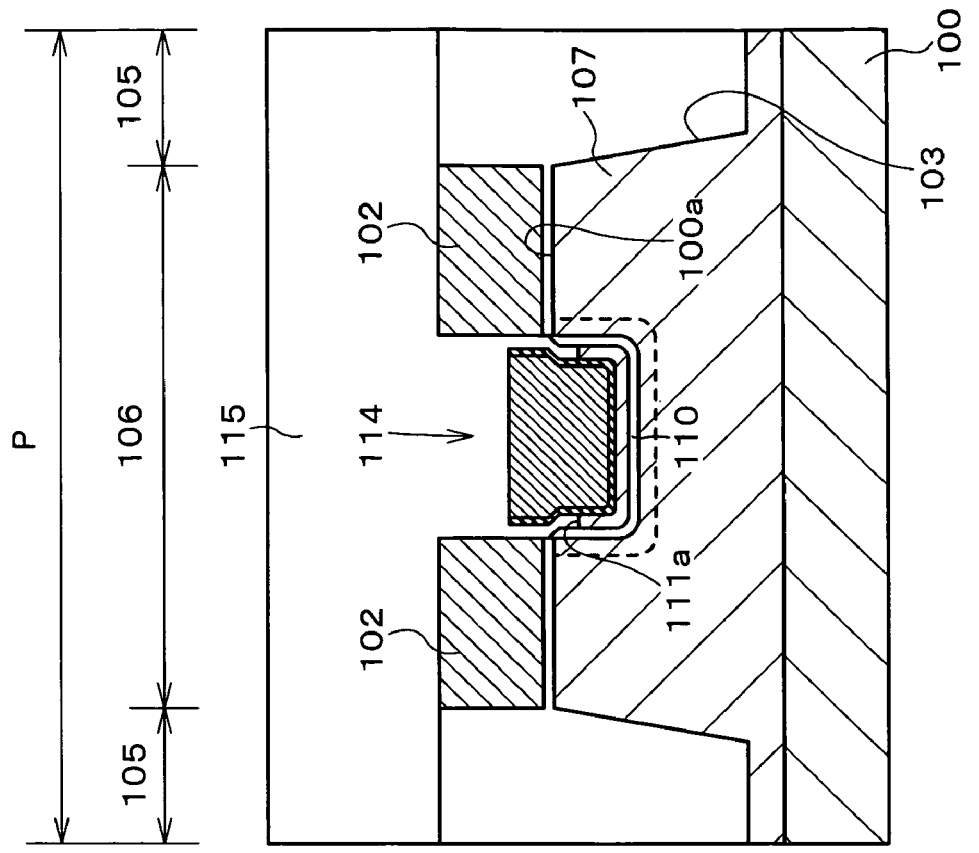
FIG. 7 is a partial cross-sectional diagram showing one process (a formation of a silicon oxide film 115) of the method of manufacturing a semiconductor device according to a first embodiment of the present invention.
Figure 7:
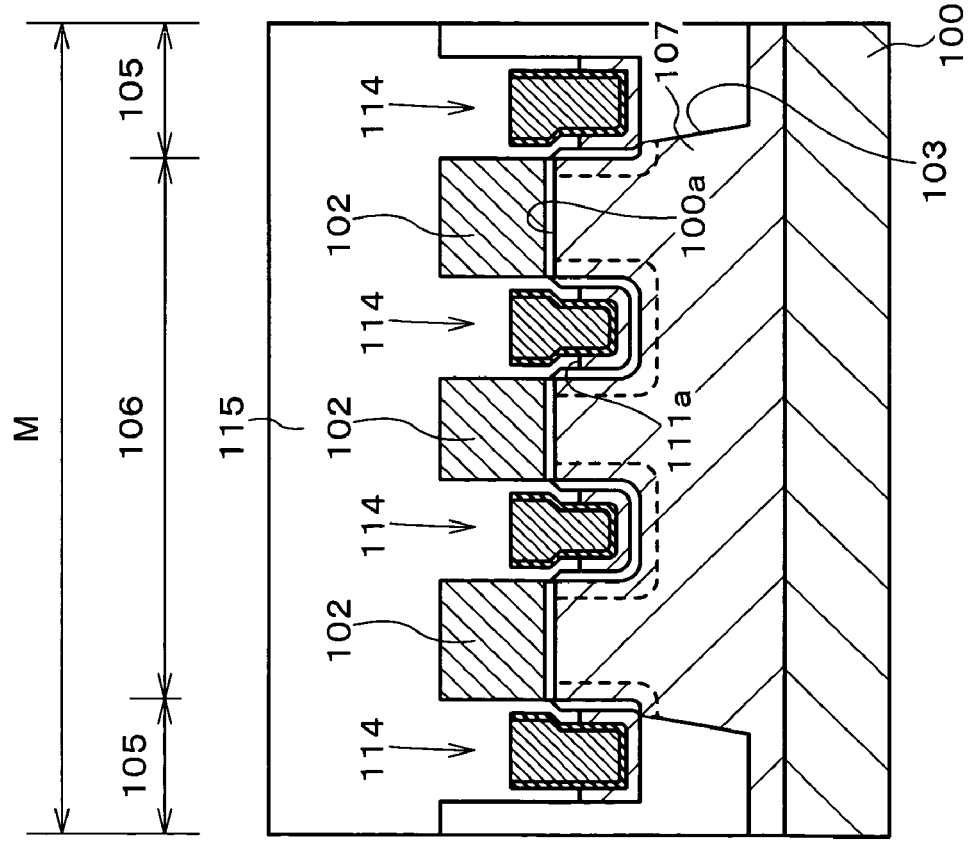
Figure 8:
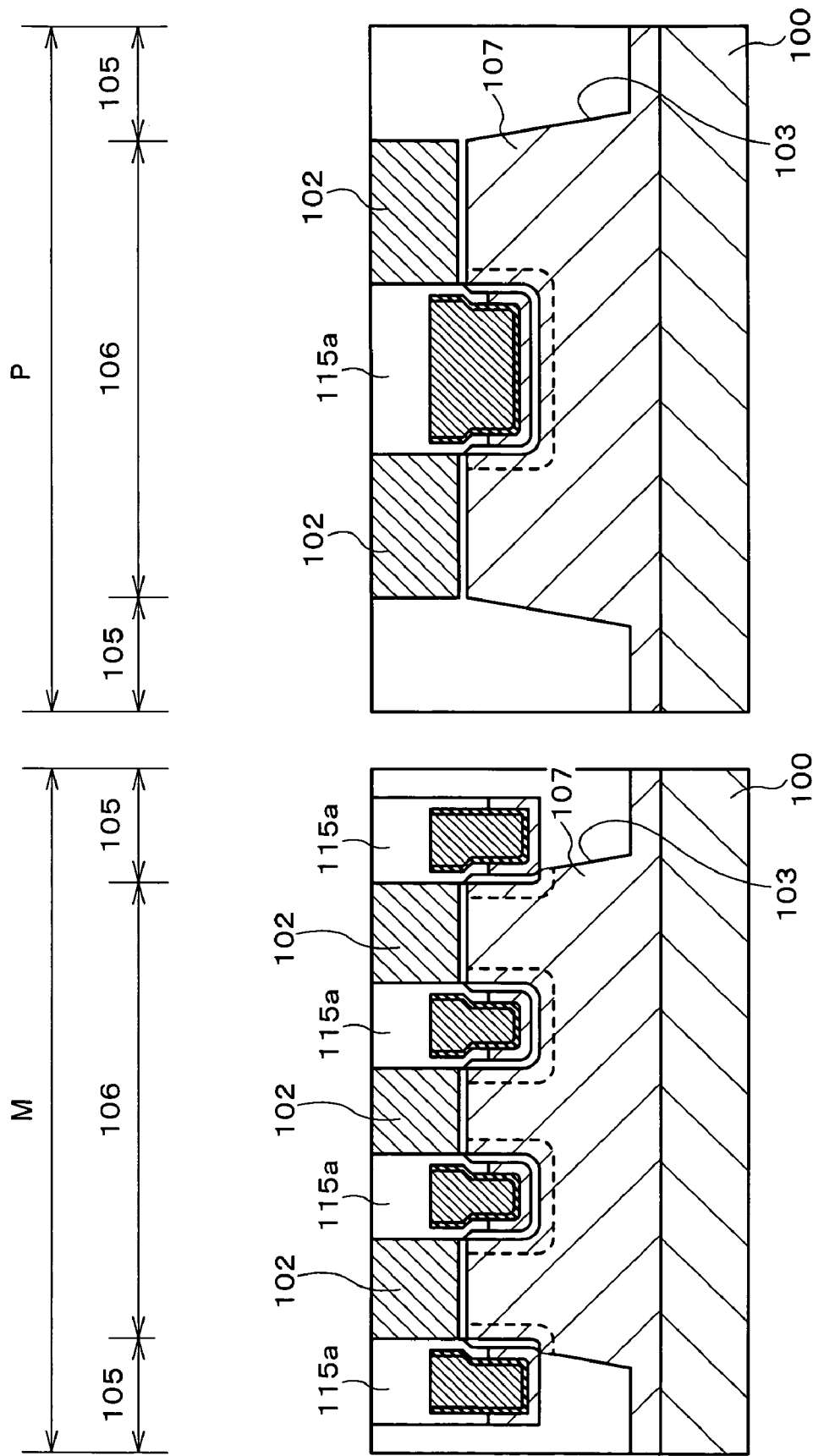
FIG. 8 is a partial cross-sectional diagram showing one process (a formation of a cap 115a) of the method of manufacturing a semiconductor device according to a first embodiment of the present invention.

Next, as shown in FIG. 7, a thick silicon oxide film 115 is formed on the whole surface by CVD. In this case, the gap 108a (see FIG. 5) needs to be filled by the silicon oxide film 115 substantially completely. Next, as shown in FIG. 8, the silicon oxide film 115 is polished by CMP until when the upper surface of the silicon nitride film 102 is exposed. With this arrangement, the upper surface of the gate electrode 114 is covered with a cap 115a. Furthermore, the gap 108a between the silicon nitride film 102 and the tungsten film 113 is filled with the cap 115a.

Figure 9:
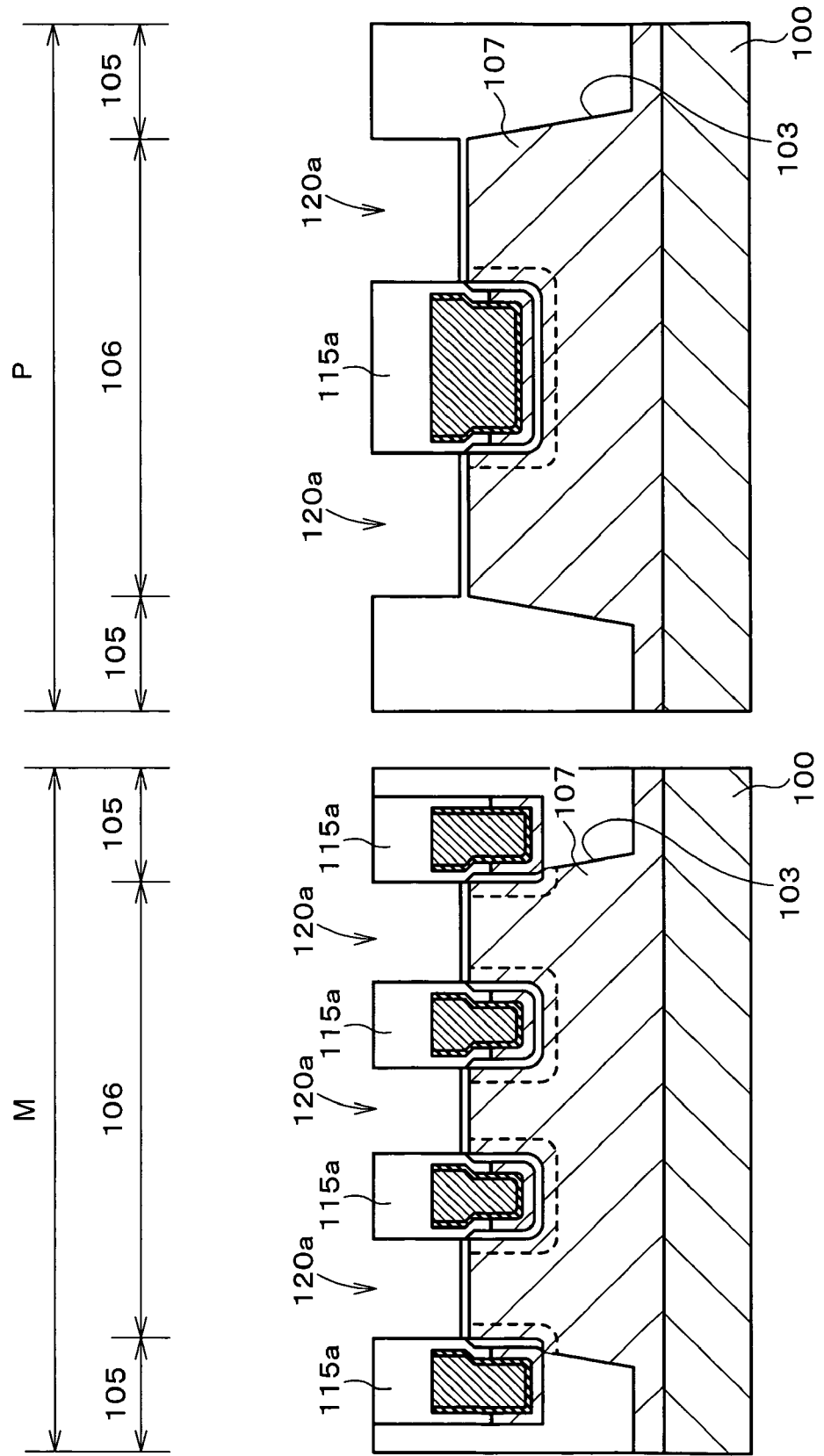
FIG. 9 is a partial cross-sectional diagram showing one process (a formation of a contact hole 120a) of the method of manufacturing a semiconductor device according to a first embodiment of the present invention.

Next, as shown in FIG. 9, the silicon nitride film 102 is all removed by etching, thereby forming a contact hole 120a. While there is no particular limit to the etching method, a method at least capable of securing high selectivity of silicon oxide as a material of the cap 115a needs to be used. As one of etching methods, wet etching using phosphoric acid ($H_3PO_4$) etchant is available.

Figure 10:
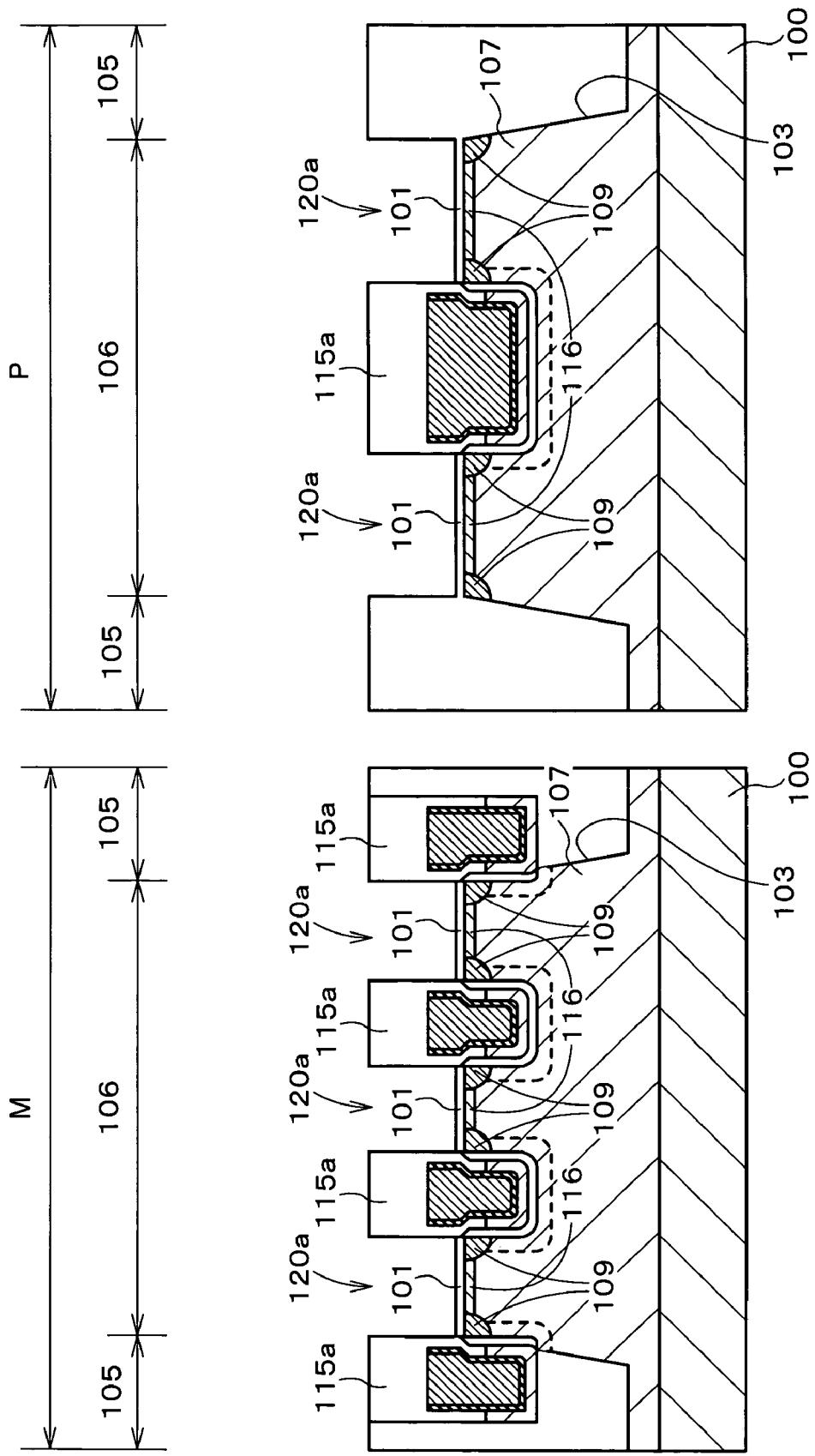
FIG. 10 is a partial cross-sectional diagram showing one process (a formation of a source/drain diffusion region 116 and an LDD region 109) of the method of manufacturing a semiconductor device according to a first embodiment of the present invention.

Next, as shown in FIG. 10, impurity such as phosphor (P) and arsenic (As) is ion-implanted, thereby forming N-type source/drain diffusion regions 116 and LDD regions 109. Preferably, the following method is used to form the source/drain diffusion regions 116 and the LDD regions 109. In order to simplify the drawings, FIGS. 11 to 16 (explained below) schematically display configurations by omitting the gate electrode 114 and the gate insulation film 110.

Figure 11:
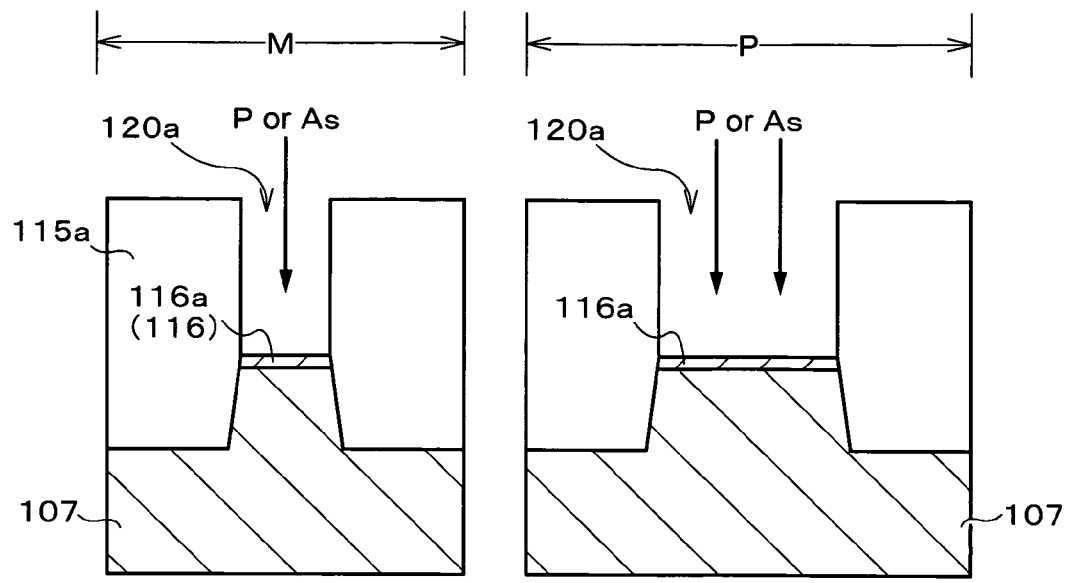
FIG. 11 is a schematic diagram for explaining a method of forming a base N— diffusion region 116a by carrying out ion-implantation (a first time) from a vertical direction.

First, as shown in FIG. 11, n-type impurity such as phosphor (P) and arsenic (As) is ion-implanted from a vertical direction, thereby forming the base $N^-$ diffusion region 116a (a first ion-implantation). Because the ion-implantation is carried out in the vertical direction, the base $N^-$ diffusion region 116a is formed common to the memory cell region M and the peripheral circuit region P. The base $N^-$ diffusion region 116a in the memory cell region M is straightly used as the source/drain diffusion region 116.

Figure 12:
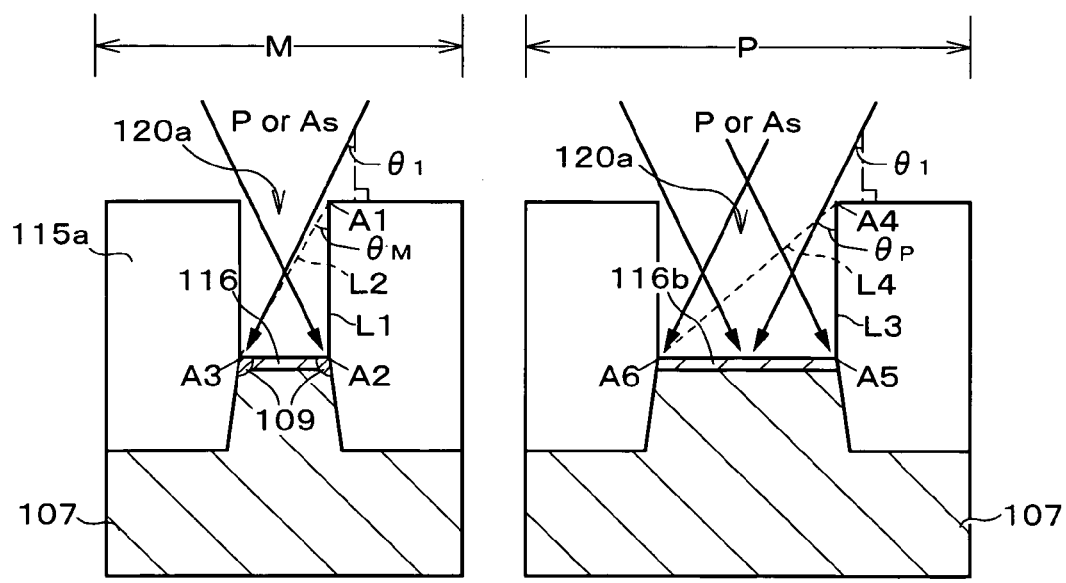
FIG. 12 is a schematic diagram for explaining a method of forming the LDD region 109 in a memory cell region M by carrying out ion-implantation (a second time) from a diagonal direction (angle $\theta_1$)

Next, as shown in FIG. 12, n-type impurity such as phosphor (P) and arsenic (As) is ion-implanted from a diagonal direction, thereby forming the LDD region 109 in the memory cell region M (a second ion-implantation). In this case, an ion-implantation angle $\theta_1$ is set slightly smaller than an angle $\theta_M$ defined by a straight line L1 connecting between an angular part A1 of the cap 115a in the memory cell region M and one end A2 of the bottom of the contact hole 120a and a straight line L2 connecting between the angular part A1 and the other end A3 of the bottom of the contact hole 120a. With this arrangement, the LDD region 109 is formed in the memory cell region M in a depth direction by the ion-implantation.

On the other hand, the width $W_M$ of the contact hole 120a in the memory cell region M and the width $M_P$ of the contact hole 120a in the peripheral circuit region P have the relationship of $W_M < W_P$ (see FIG. 3). Therefore, an angle $\theta_P$ defined by a straight line L3 connecting between an angular part A4 of the cap 115a in the peripheral circuit region P and one end A5 of the bottom of the contact hole 120a and a straight line L4 connecting between the angular part A4 and the other end A6 of the bottom of the contact hole 120a necessarily becomes larger than the angle $\theta_M$ defined by the straight line L1 and the straight line L2 ($\theta_M < \theta_P$). Consequently, impurity such as phosphor (P) and arsenic (As) is ion-implanted again into the whole peripheral circuit region P, thereby forming a diffusion region 116b.

Figure 13:
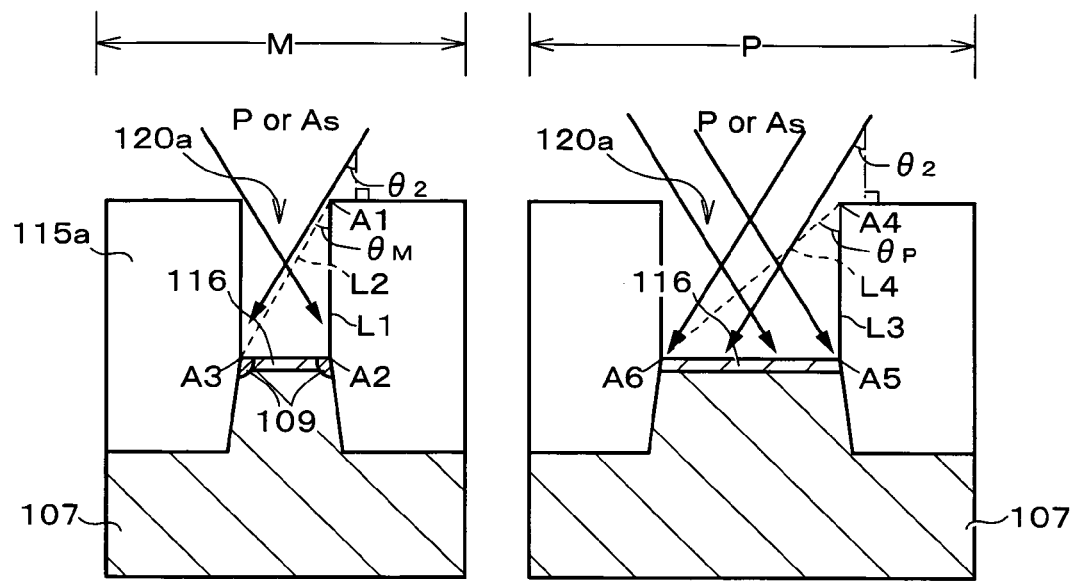
FIG. 13 is a schematic diagram for explaining a method of forming the source/drain diffusion region 116 in a peripheral circuit region P by carrying out ion-implantation (a third time) from a diagonal direction (angle $\theta_2$)

Next, as shown in FIG. 13, n-type impurity such as phosphor (P) and arsenic (As) is ion-implanted from a diagonal direction, thereby forming the source/drain diffusion region 116 in the peripheral circuit region P (a third ion-implantation). In this case, the ion-implantation angle $\theta_2$ is set larger than the above angle $\theta_M$ and sufficiently smaller than the above angle $\theta_P$. With this arrangement, the ion-implantation gives no influence to the memory cell region M, and, impurity such as phosphor (P) and arsenic (As) is ion-implanted again into the whole peripheral circuit region P, thereby completing the source/drain diffusion region 116.

Figure 14:
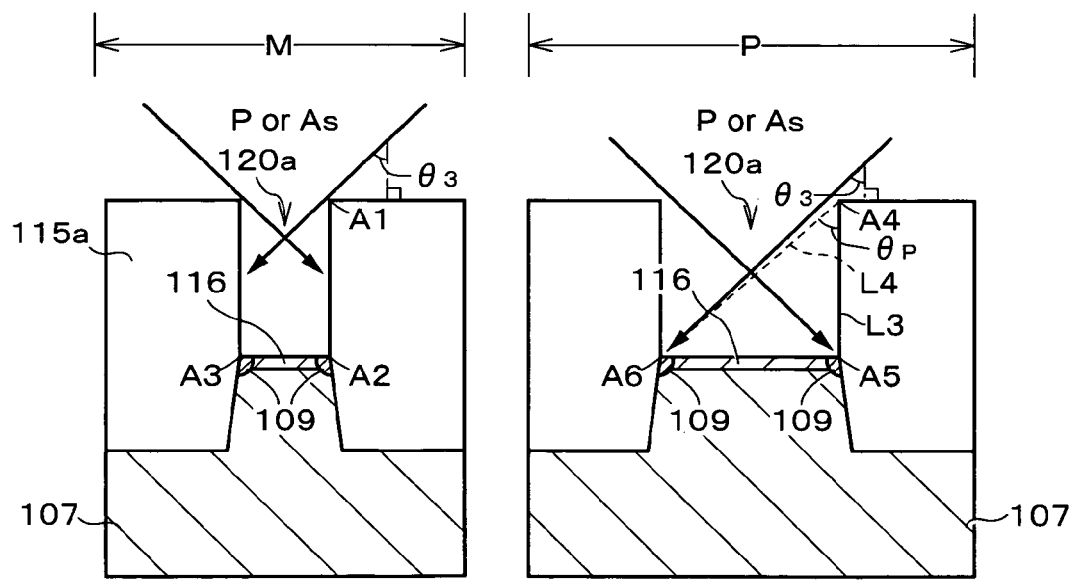
FIG. 14 is a schematic diagram for explaining a method of forming the LDD region 109 in the peripheral circuit region P by carrying out ion-implantation (a fourth time) from a diagonal direction (angle $\theta_3$)

As shown in FIG. 14, n-type impurity such as phosphor (P) and arsenic (As) is ion-implanted, and p-type impurity such as boron (B) is ion-implanted according to need, from a diagonal direction, thereby forming the LDD region 109 in the peripheral circuit region P (a fourth ion-implantation). In this case, the ion-implantation angle $\theta_3$ is set slightly smaller than the above angle $\theta_P$. With this arrangement, the LDD 109 can be formed in a depth direction in the peripheral circuit region P without affecting the memory cell region M.

According to the above method, the source/drain diffusion regions 116 and the LDD regions 109 can be formed in self-alignment in the memory cell area M and the peripheral circuit area P, without individually carrying out ion-implantation by using a mask, or without a mask (or by using a common mask).

Figure 15:
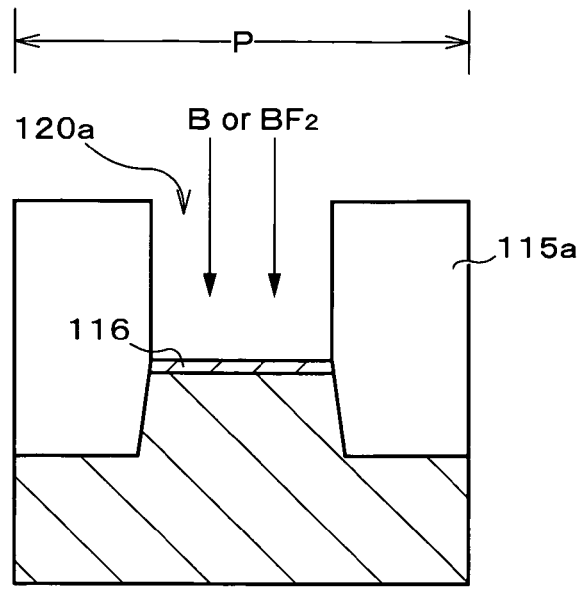
FIG. 15 is a schematic diagram for explaining a method of forming the source/drain diffusion region 116 in a region in which a P-type MOS transistor is to be formed, by carrying out ion-implantation from a vertical direction.
Figure 16:
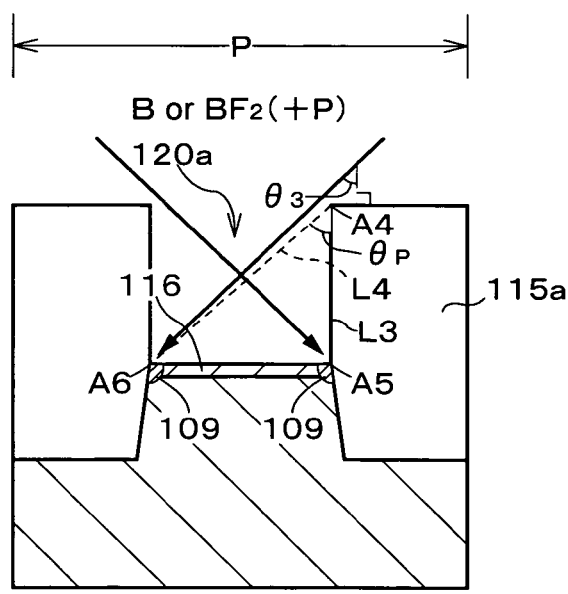
FIG. 16 is a schematic diagram for explaining a method of forming the LDD region 109 in the region in which a P-type MOS transistor is to be formed, by carrying out ion-implantation from the diagonal direction (angle $\theta_3$)

On the other hand, when a circuit to be formed in the peripheral circuit region P is to have a CMOS configuration, it is necessary to ion-implant p-type impurity into a region in which a P-type MOS transistor is to be formed, in the state that the region in which the N-type MOS transistor is to be formed in the peripheral circuit region P and the whole memory cell region M are covered with a mask. In this case, as shown in FIG. 15, P-type impurity such as boron (B) and boron fluoride ($BF_2$) is ion-implanted from a vertical direction, thereby forming the P-type source/drain diffusion region 116. Next, as shown in FIG. 16, P-type impurity such as boron (B) and boron fluoride ($BF_2$) is ion-implanted from a diagonal direction, thereby forming the LDD region 109 in a depth direction. In this case, the ion-implantation angle $\theta_3$ is set slightly smaller than the above angle $\theta_P$.

Figure 17:
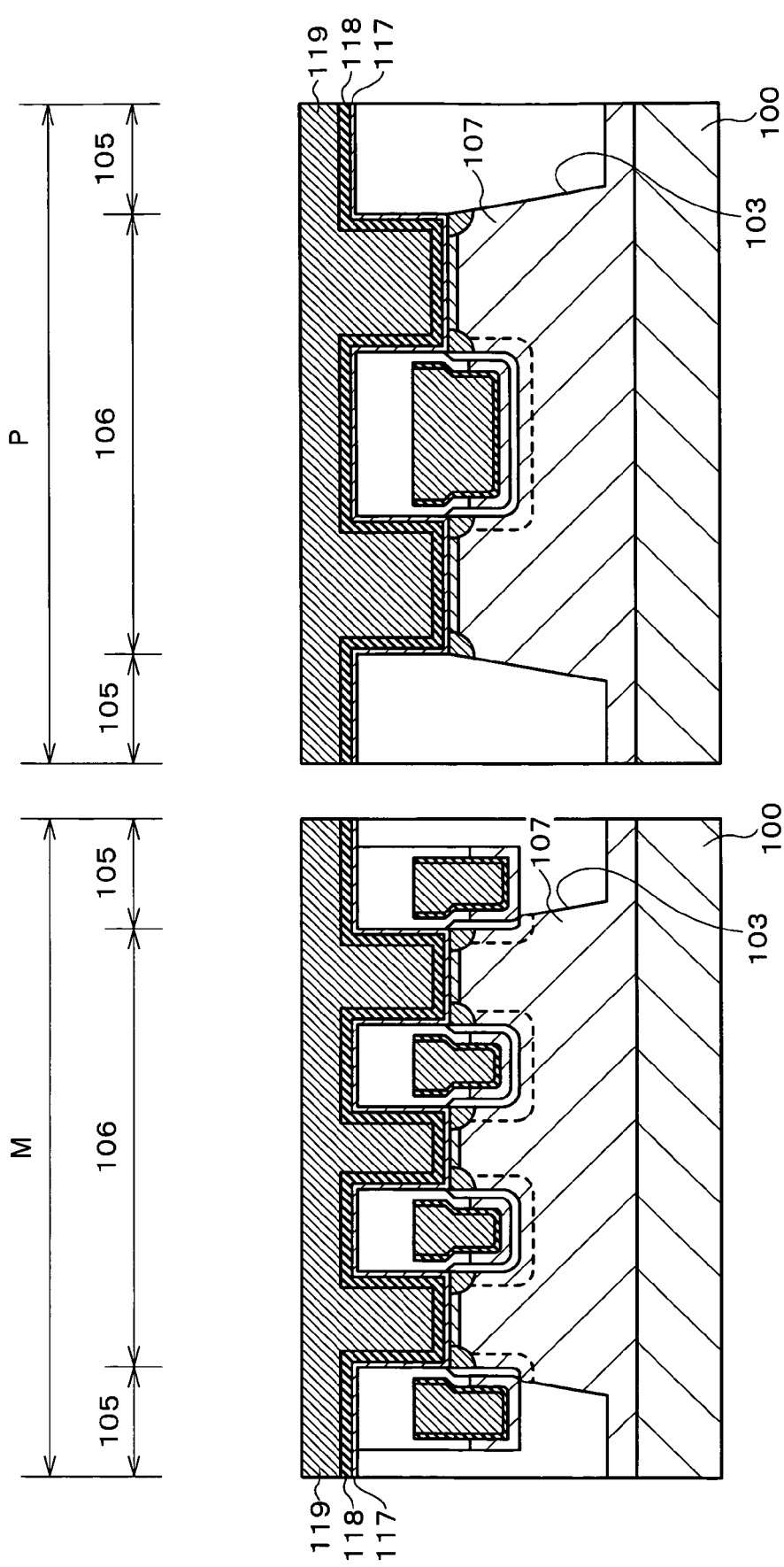
FIG. 17 is a partial cross-sectional diagram showing one process (a formation of a titanium film 117, a titanium nitride film 118, and a blanket tungsten film 119) of the method of manufacturing a semiconductor device according to a first embodiment of the present invention.

After the source/drain diffusion regions 116 and the LDD regions 109 are formed in this way, the silicon oxide film 101 is removed from the top of the source/drain diffusion regions 116 as shown in FIG. 17. Furthermore, a titanium (Ti) film 117, a titanium nitride (TiNx) film 118, and a blanket tungsten (W) film 119 are sequentially deposited by CVD. The titanium film 117 is used to form silicide. The titanium nitride film 118 works as a barrier layer between the titanium film 117 and the blanket tungsten film 119. The titanium film 117 is set have a film thickness of about 8 to 12 nm, and the titanium nitride film 118 is set to have a film thickness of about 13 to 17 nm. On the other hand, the blanket tungsten film 119 needs to have a sufficiently large thickness to completely fill at least the contact hole 120a. In the present embodiment, because the aspect ratio of the contact hole 120a is sufficiently small, the above various kinds of conductive materials can be buried without difficulty.

Figure 18:
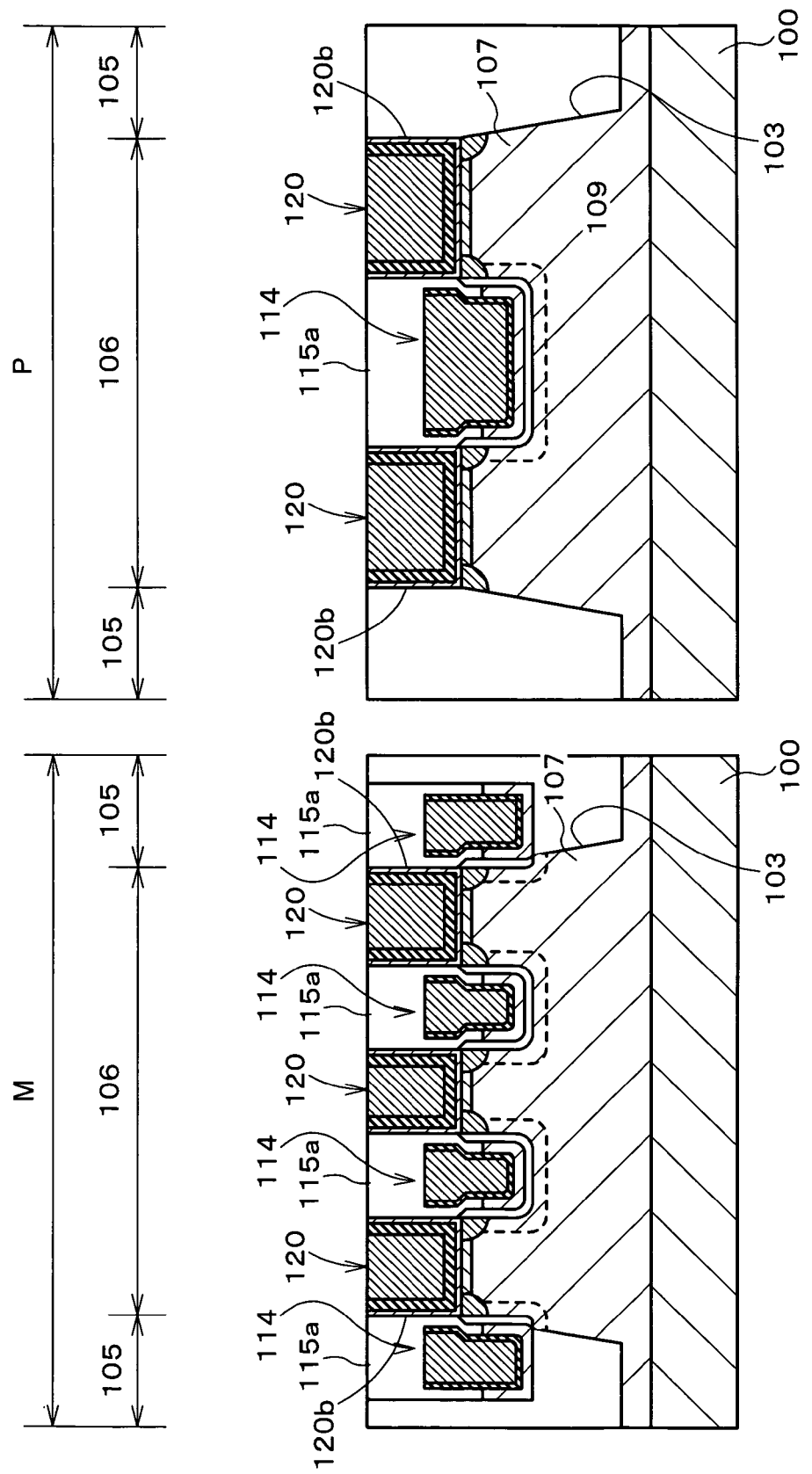
FIG. 18 is a partial cross-sectional diagram showing one process (a formation of a contact plug 120) of the method of manufacturing a semiconductor device according to a first embodiment of the present invention.

Next, as shown in FIG. 18, the titanium film 117, the titanium nitride film 118, and the blanket tungsten film 119 are polished by CMP until when the upper surface of the cap 115a is exposed. With this arrangement, the contact plug 120 is buried in the contact hole 120a (see FIG. 10). Insulation between the contact plug 120 and the gate electrode 114 is secured by a part of the cap 115a buried in the gap 108a (see FIG. 5) provided at the time of etching back the polycrystalline silicon film 111.

Figure 19:
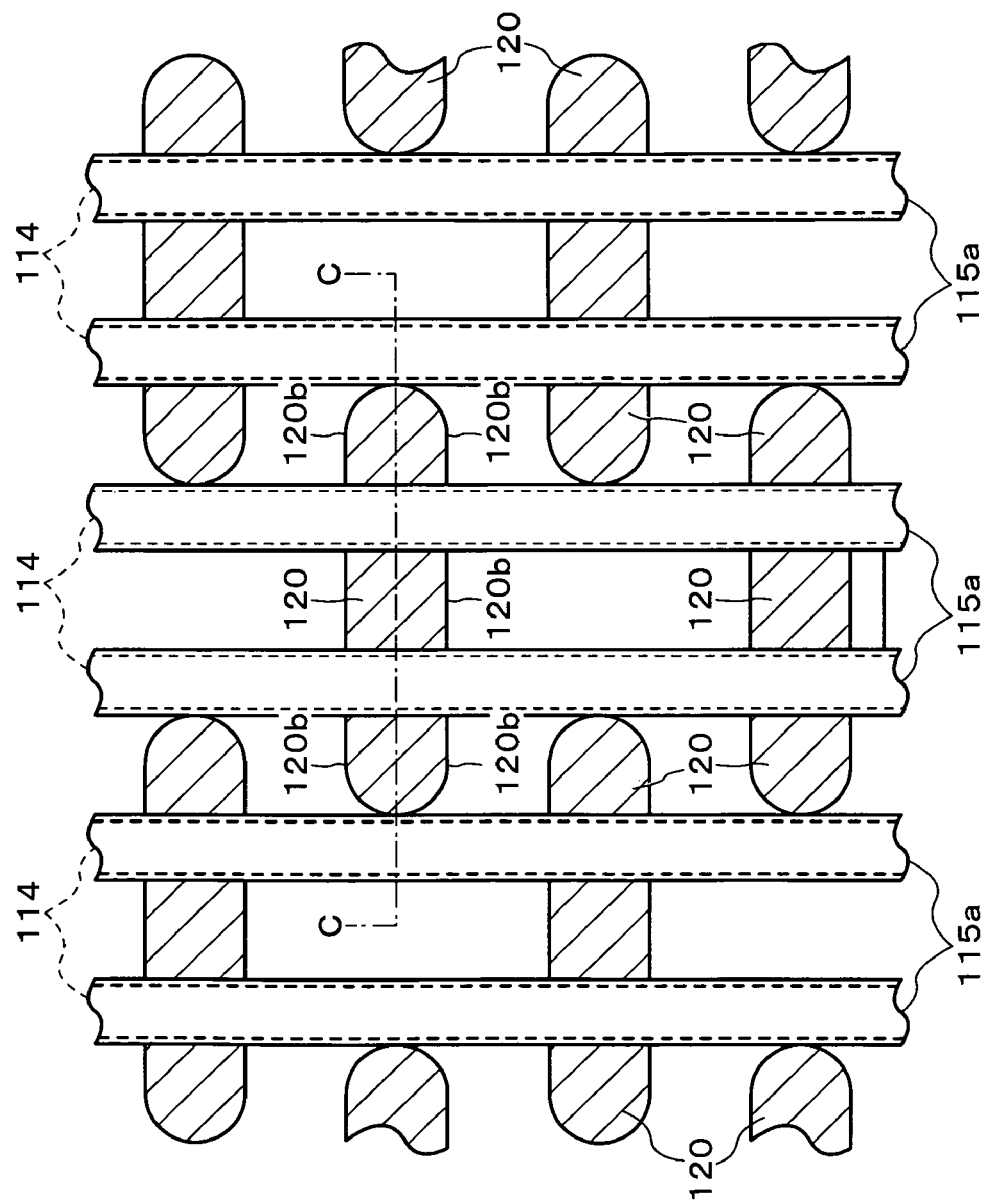
FIG. 19 is a partial top plan view of a pattern shape of the memory cell region M in which the process shown in FIG. 18 is completed.

FIG. 19 is a partial top plan view showing a pattern shape of the memory cell region M in which the above process is completed. A cross section along a line C-C in FIG. 19 corresponds to the cross section of the memory cell region M shown in FIG. 18. As shown in FIG. 19, upon completing the above process, the contact plug 120 is formed in self alignment in the active region 106. Therefore, as shown in FIG. 18 and FIG. 19, a periphery 120b of the contact plug 120 at the isolation region 105 side substantially coincides with the boundary between the isolation region 105 and the active region 106. This means that the active region 106 is substantially covered with the gate electrode 114 (the cap 115a) and the contact plug 120.

Consequently, in the memory cell region M, a reduction in the refresh characteristic owing to a mask deviation can be prevented. In the peripheral circuit P, the active region 106 is not required to be formed slightly wider, unlike the conventional active region 106 having a wide area considering margin to form a contact plug using a mask pattern (a diffusion layer contact pattern). Accordingly, the area of the active region 106 can be minimized.

Figure 20:
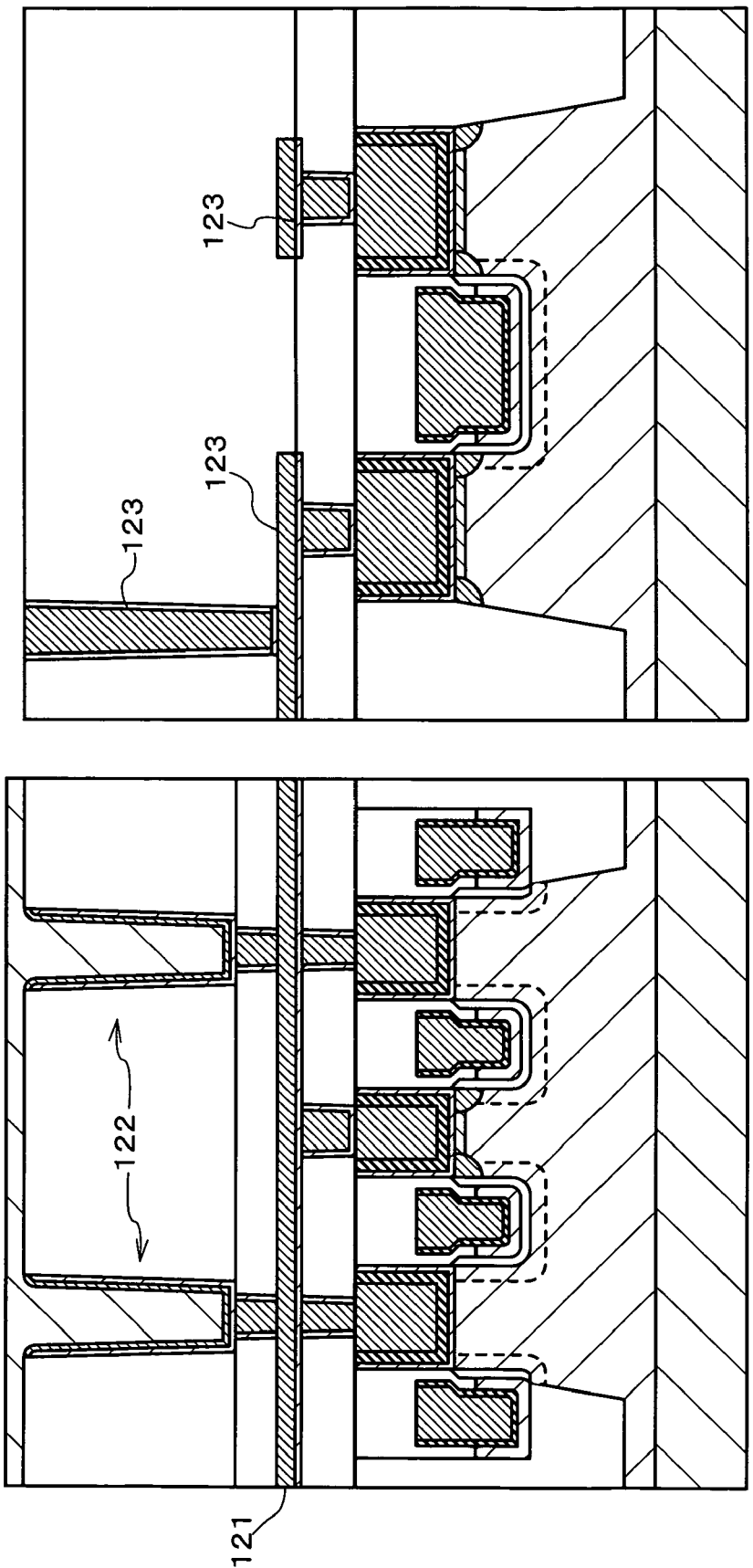
FIG. 20 is a cross-sectional diagram showing a first embodiment of the present invention.

Thereafter, as shown in FIG. 20, a bit line 121 and a memory cell capacitor 122 are formed in the memory cell region M, and various necessary conductive patterns 123 are formed in the peripheral circuit region P using a general method. Necessary conductive layers (not shown) are further formed above the memory cell region M and the peripheral circuit region P, thereby completing the semiconductor device according to the first embodiment.

As explained above, according to the first embodiment, the gate electrode 114 and the contact plug 120 are formed using the silicon nitride film 102 as the field-forming insulation film. Therefore, the contact plug 120 can be formed in self alignment in the active region 106. In other words, the contact plug 120 can be formed without using a mask pattern (a diffusion layer contact pattern) Accordingly, the number of steps of the photolithography process can be reduced. Furthermore, as shown in FIG. 18 and FIG. 19, the periphery 120b of the contact plug 120 at the isolation region 105 side substantially coincides with the boundary between the isolation region 105 and the active region 106. Consequently, in the memory cell region M, a degradation in the refresh characteristic can be prevented. In the peripheral circuit region P, the area of the active region can be substantially reduced unlike the conventional practice.

According to the first embodiment, the aspect ratio of the gate trench 114b and the contact hole 120a can be sufficiently restricted. Therefore, various kinds of materials constituting the gate electrode 114 and various kinds of materials constituting the contact plug 120 can be buried easily.

According to the first embodiment, the gate electrode 114 is buried into the gate trench formed on the semiconductor substrate 100, and the surrounding of the gate trench is used as a channel region. Therefore, a sub-threshold current due to the short-channel effect can be decreased. Accordingly, a refresh characteristic can be increased.

A semiconductor device according to a second embodiment of the present invention now will be explained. In the subsequent drawings, constituent elements equivalent to those according to the first embodiment are assigned with like reference numerals, and a redundant explanation is omitted.

Figure 21:
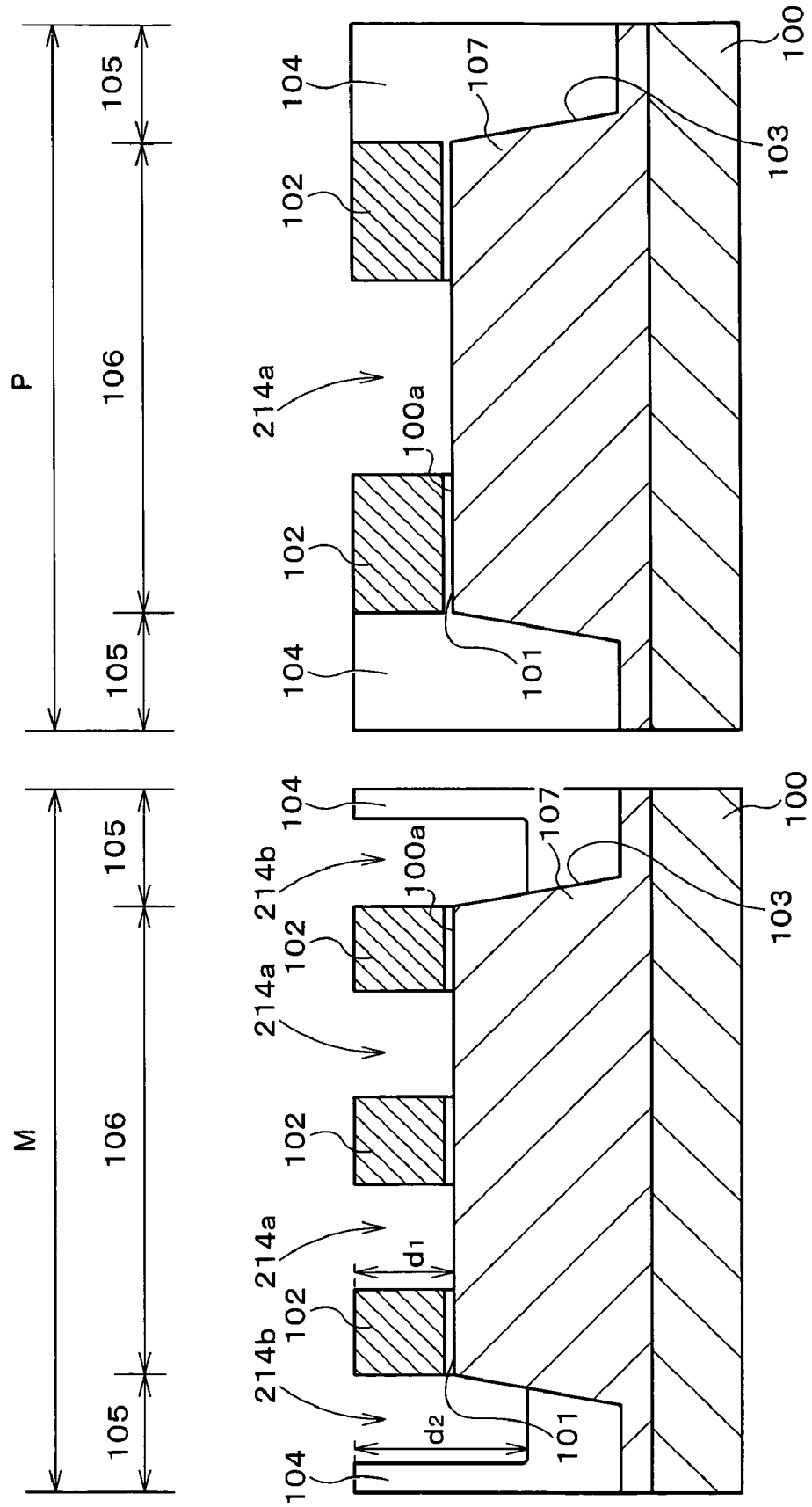
FIG. 21 is a partial cross-sectional diagram showing one process (a formation of a gate trenches 214a, 214b) of a method of manufacturing a semiconductor device according to a second embodiment of the present invention.

After carrying out the processing according to the first embodiment shown in FIG. 1 and FIG. 2, the silicon nitride film 102 and the silicon oxide film 104 that are present in the region 114a (see FIG. 2) in which a gate electrode is to be formed are etched using a mask pattern (a gate electrode pattern) (not shown). Accordingly, as shown in FIG. 21, a gate trench 214a is formed on the silicon nitride film 104 on the active region 106, and a gate trench 214b is formed on the silicon oxide film 104 on the element isolation region 105. In this case, an over-etching is carried out by an etching method having high selectivity of silicon (Si). Based on this, a depth $d_2$ of the gate trench 214b formed in the element isolation region 105 is set larger than a depth $d_1$ of the gate trench 214a formed in the active region 106. Accordingly, in the active region 106, the surface of the semiconductor substrate 100 (a p-type well layer 107) is exposed at the bottom of a trench pattern 214a.

Figure 22:
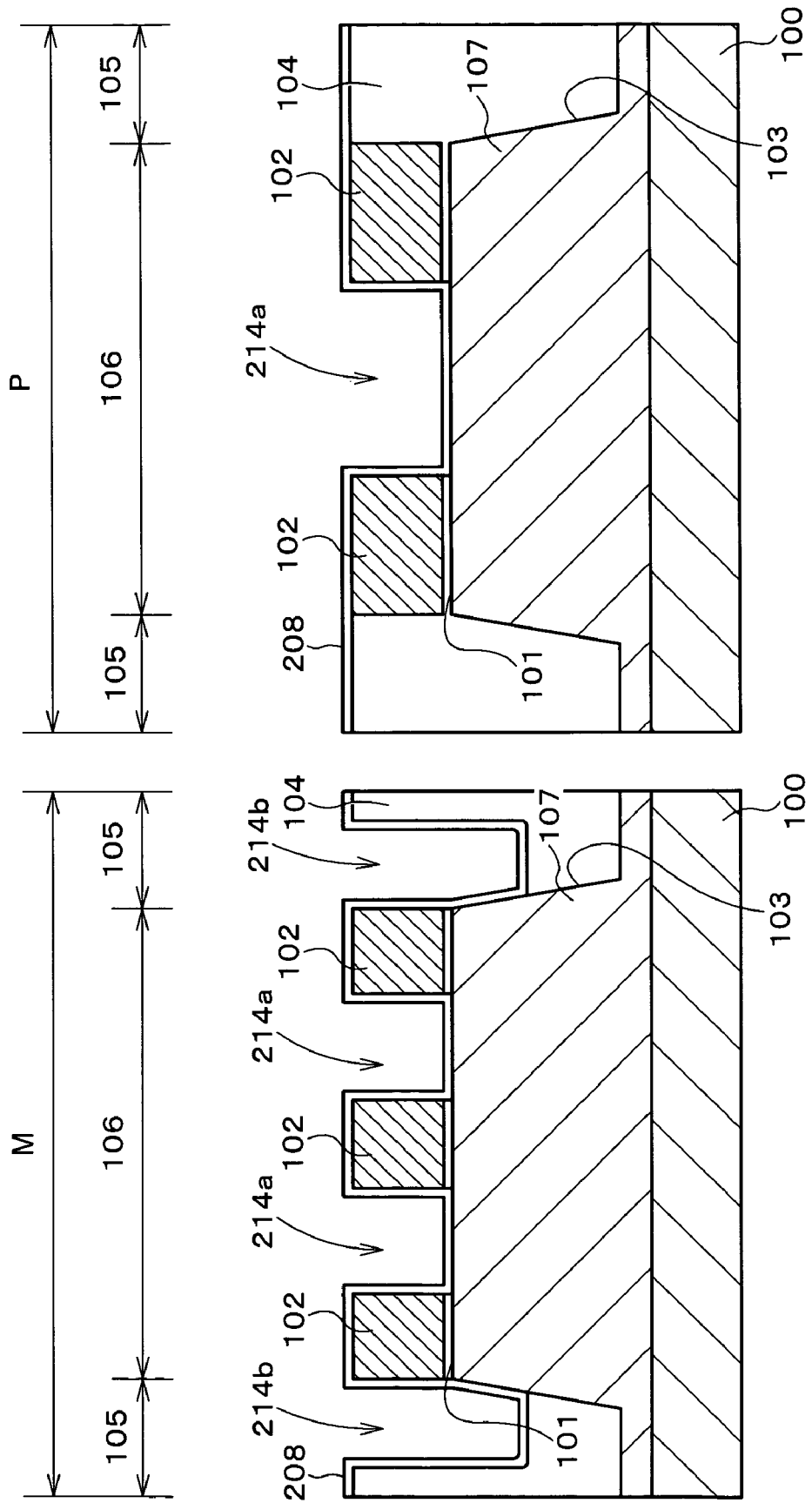
FIG. 22 is a partial cross-sectional diagram showing one process (a formation of a silicon oxide film 208) of the method of manufacturing a semiconductor device according to a second embodiment of the present invention.
Figure 23:
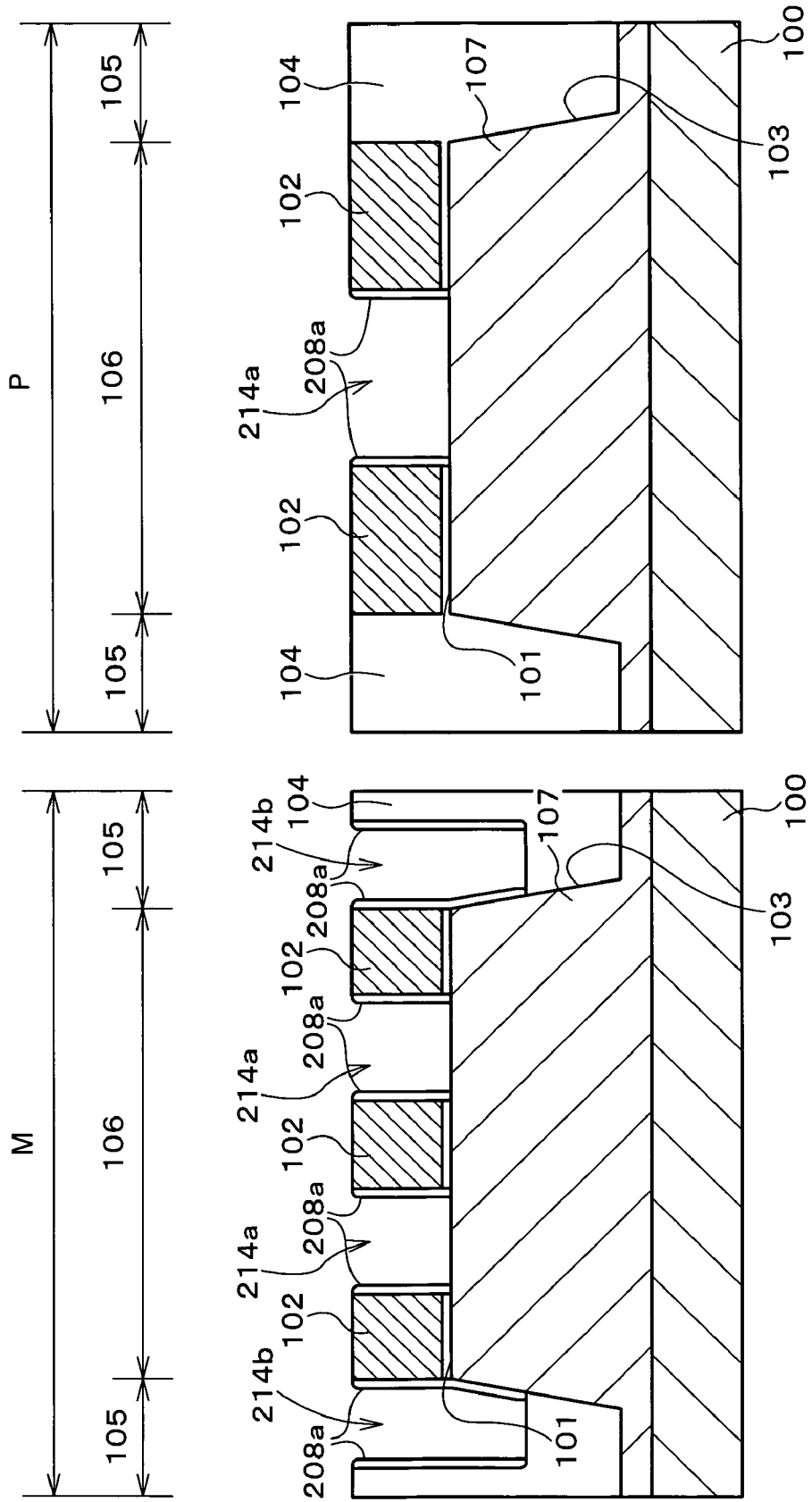
FIG. 23 is a partial cross-sectional diagram showing one process (a formation of a sidewall 208a) of the method of manufacturing a semiconductor device according to a second embodiment of the present invention.

Next, the mask pattern is removed, and a silicon oxide film 208 is formed in the film thickness of about 10 to 20 nm on the whole surface by low pressure chemical vapor deposition (LPCVD) as shown in FIG. 22. The silicon oxide film 208 is then etched back as shown in FIG. 23. Accordingly, all the silicon oxide film 208 formed on the surface substantially parallel with the surface of the semiconductor substrate 100 is removed, and a sidewall 208a is formed on the side surfaces of the gate trenches 214a and 214b. Although not shown in the drawing, a sidewall is formed at a stage that is generated at the boundary between the isolation region 105 and the active region 106.

Figure 24:
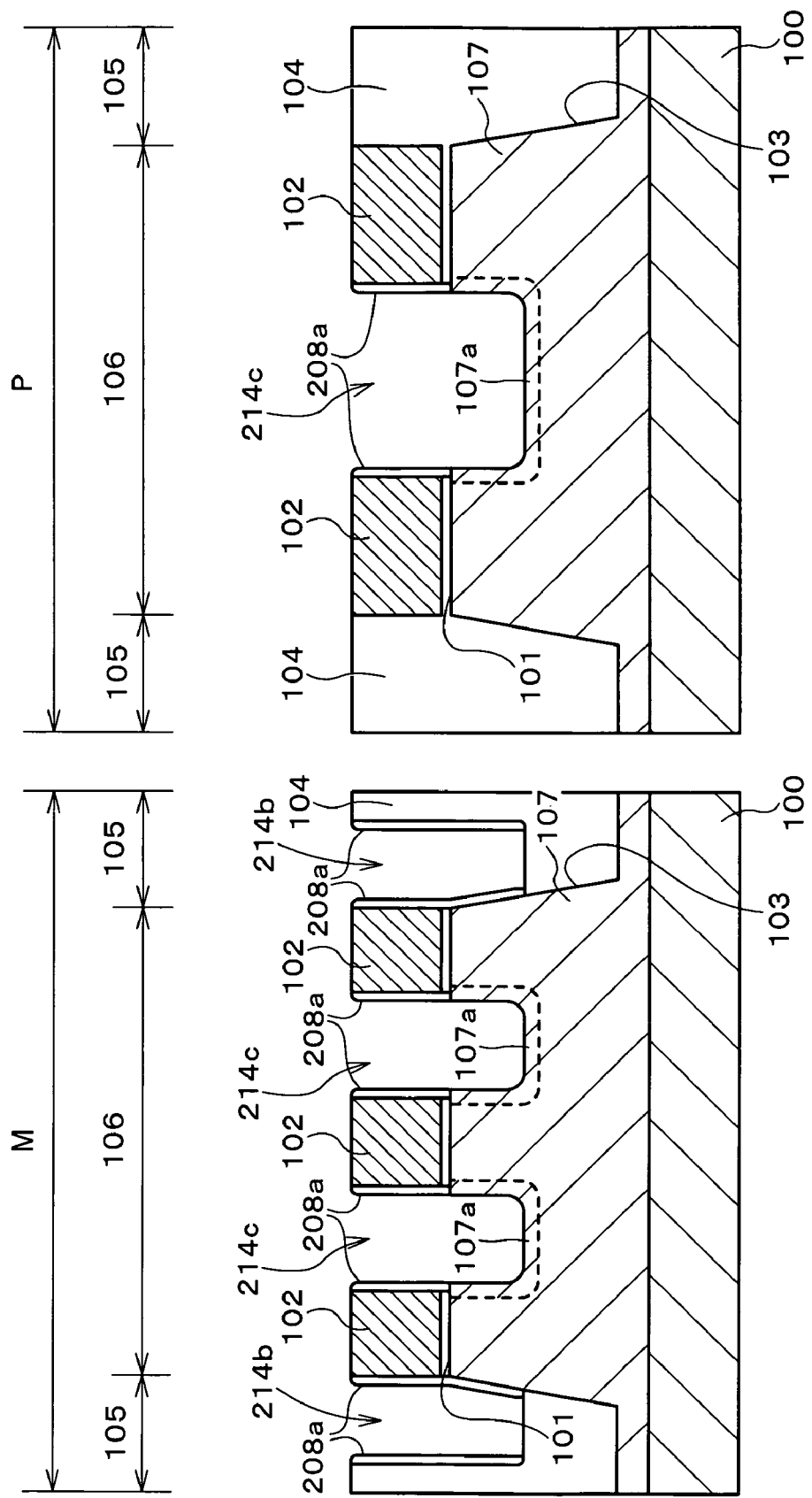
FIG. 24 is a partial cross-sectional diagram showing one process (a formation of a gate trench 214c) of the method of manufacturing a semiconductor device according to a second embodiment of the present invention.

Next, the semiconductor substrate 100 (the p-type well layer 107) is etched using the silicon nitride film 102, the silicon oxide film 104, and the sidewall 208a as masks, thereby further etching the gate trench 214a formed in the active region 106. A deep gate trench 214c is also formed within the semiconductor substrate 100 as shown in FIG. 24. Preferably, the gate trench 214c has a depth substantially the same as the depth $d_2$ of the gate trench 214c (see FIG. 21) formed in the isolation region 105. Thereafter, the channel region 107a is channel-doped according to need.

As explained above, according to the second embodiment, it is necessary to etch the semiconductor substrate 100 (the p-type well layer 107) using the silicon nitride film 102 as a mask. Because a film thickness of the silicon nitride film 102 slightly reduces by this etching, the silicon nitride film 102 needs to be set with a slightly large thickness in advance. A large part of the sidewall formed at the stage of the boundary between the isolation region 105 and the active region 106 is removed at the time of forming the gate trench 214c. The sidewall can be removed to a level at which the gate wiring is not disconnected, in the cleaning process after the etching.

Figure 25:
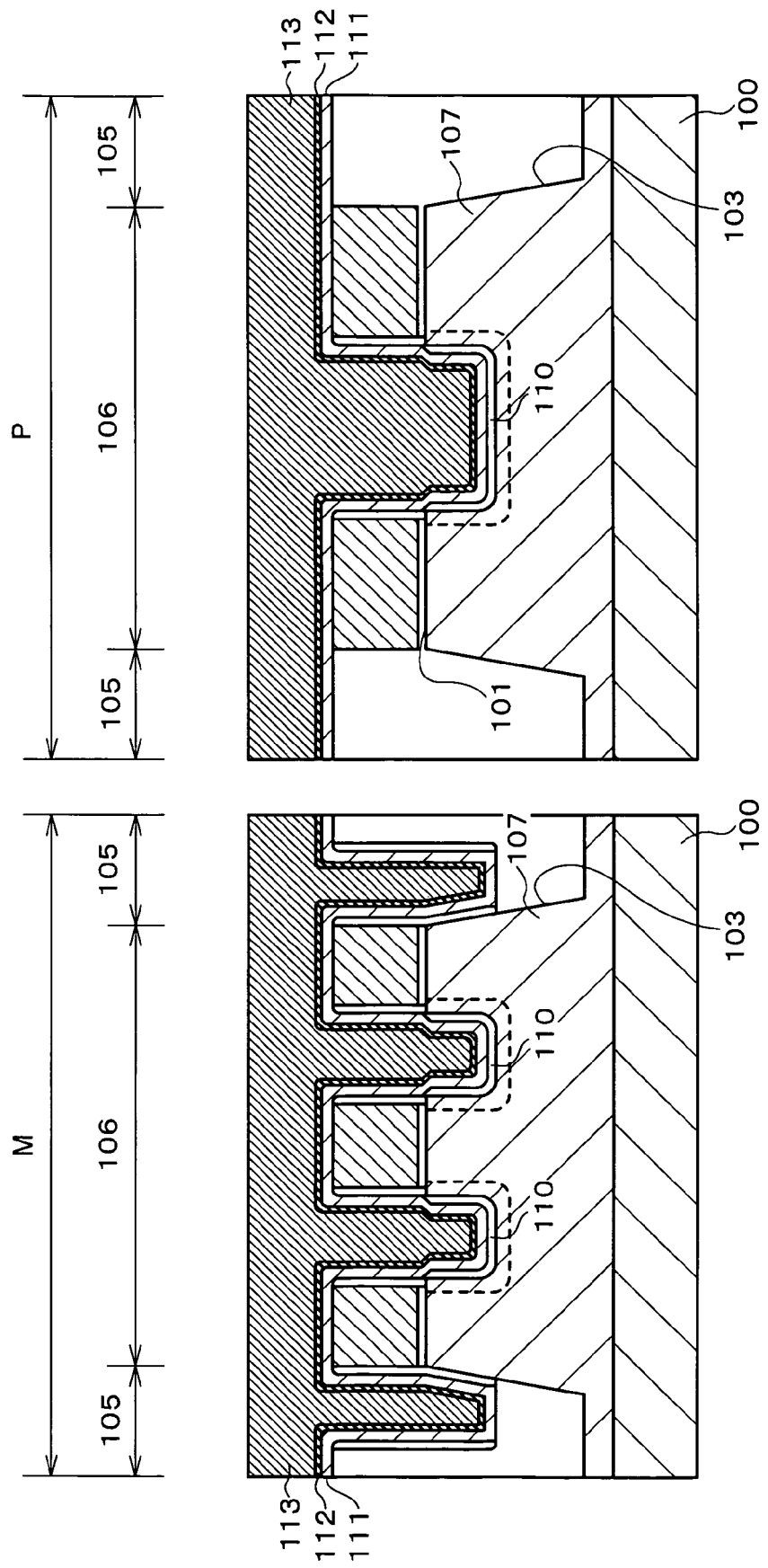
FIG. 25 is a partial cross-sectional diagram showing one process (a formation of a polycrystalline silicon film 111, a tungsten nitride film 112, and a tungsten film 113) of the method of manufacturing a semiconductor device according to a second embodiment of the present invention.

Next, as shown in FIG. 25, a gate insulation film 110 is formed on the surface of the gate trench 214c by thermal oxidation. After this, the polycrystalline silicon film 111, the tungsten nitride film 112, and the tungsten film 113 are deposited sequentially. In this case, the polycrystalline silicon film 111 and the tungsten nitride film 112 need to have a small thickness so as to avoid the gate trench 214c from being completely filled. The tungsten film 113 needs to have a sufficiently large thickness to completely fill at least the gate trench 214c.

Figure 26:
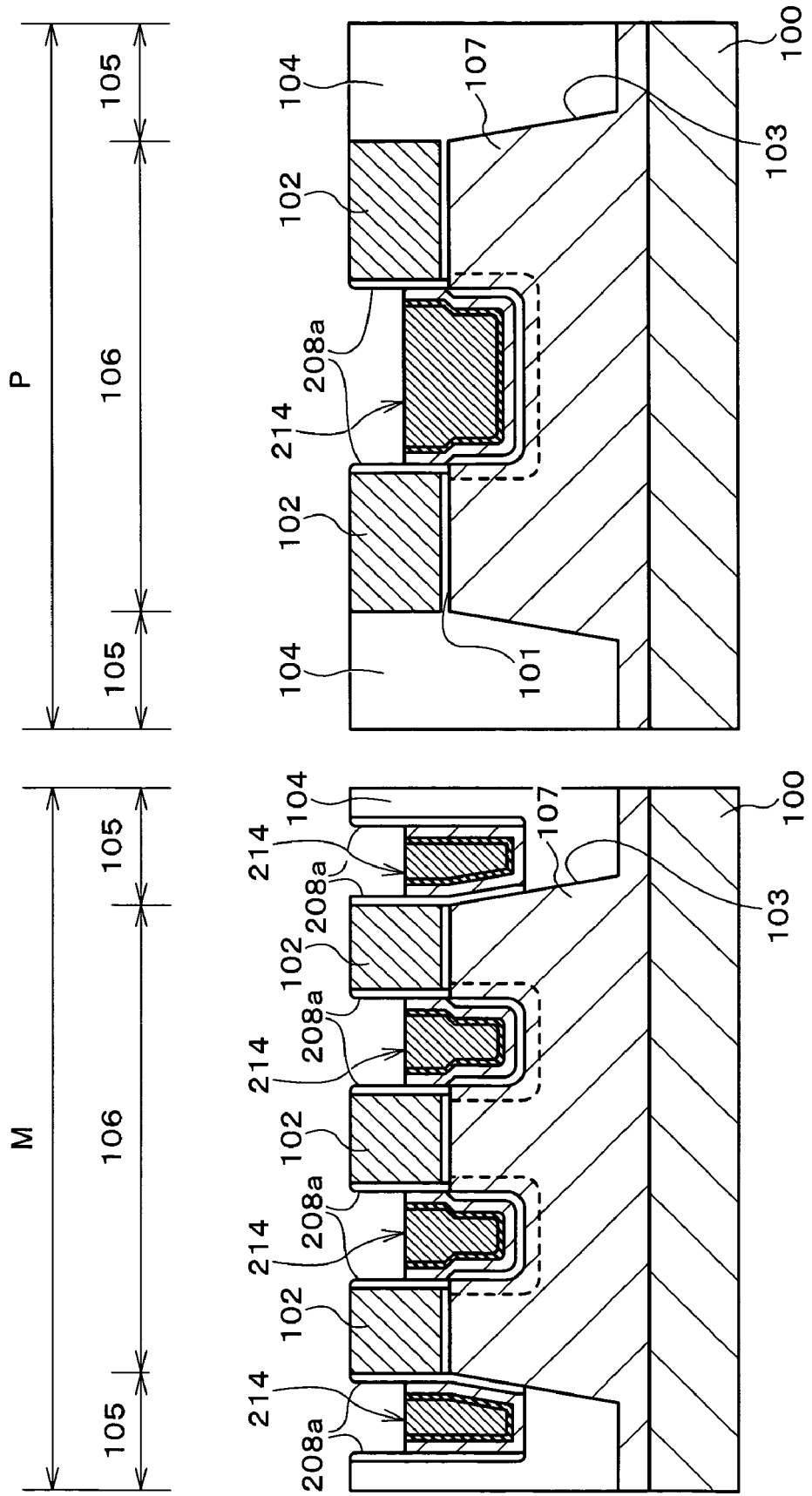
FIG. 26 is a partial cross-sectional diagram showing one process (a formation of a gate electrode 214) of the method of manufacturing a semiconductor device according to a second embodiment of the present invention.

Next, as shown in FIG. 26, the tungsten film 113 and the tungsten nitride film 112 are etched back, and further, the polycrystalline silicon film 111 is etched back. These films need to be etched back so that the upper surfaces of the tungsten film 113 and the polycrystalline silicon film 111 are set lower than the upper surface of the silicon nitride film 102 that is the field-forming insulation film. A step generated by this processing is set so that the polishing processing margin of the cap 115a explained in the first embodiment is absorbed. Accordingly, the gate electrode 214 is buried into the gate trench 214c.

According to the second embodiment, the sidewall 208a is formed on the side surface of the silicon nitride film 102. Therefore, the upper surface (the etching end surface) of the polycrystalline silicon film 111 does not need to be set lower than the main surface of the semiconductor substrate 100, unlike the arrangement in the first embodiment. Therefore, the gap 108a shown in FIG. 5 does not need to be formed by isotropic etching of the polycrystalline silicon film 111.

The subsequent processing is similar to that according to the first embodiment. After the cap 115a is formed on the upper surface of the gate electrode 214 (see FIG. 8), the silicon nitride film 102 is removed, thereby forming the contact hole 120a (see FIG. 9). It is important that both the insulation material that constitutes the cap 115a and the insulation material that constitutes the sidewall 208a are "silicon oxide". With this arrangement, only the silicon nitride film 102 as the field-forming insulation film can be selectively removed without corroding the cap 115a and the sidewall 208a. Consequently, the contact hole 120a can be formed in self alignment in the active region 106.

Furthermore, after the source/drain diffusion regions 116 and the LDD regions 109 are formed (see FIG. 10), the contact plug 120 is formed (see FIG. 18). As described above, because the contact hole 120a can be formed in self alignment in the active region 106, the contact plug 120 can be also formed in self alignment in the active region 106. After the bit line 121 and the memory capacitor 122 are formed (see FIG. 20), wiring layers are formed on them by a necessary number. A semiconductor device according to the present embodiment can be thus completed.

As explained above, according to the second embodiment, the gap 108a shown in FIG. 5 does not need to be formed by isotropic etching of the polycrystalline silicon film 111. Therefore, the etching condition of the polycrystalline silicon film 111 can be substantially relieved, in addition to obtaining the effect according to the first embodiment. Furthermore, because the total thickness of the gate electrode 214 can be set large, gate resistance can be reduced.

A semiconductor device according to a third embodiment of the present invention now will be explained. In the subsequent drawings, constituent elements equivalent to those according to the first embodiment are assigned with like reference numerals, and a redundant explanation is omitted.

Figure 27:
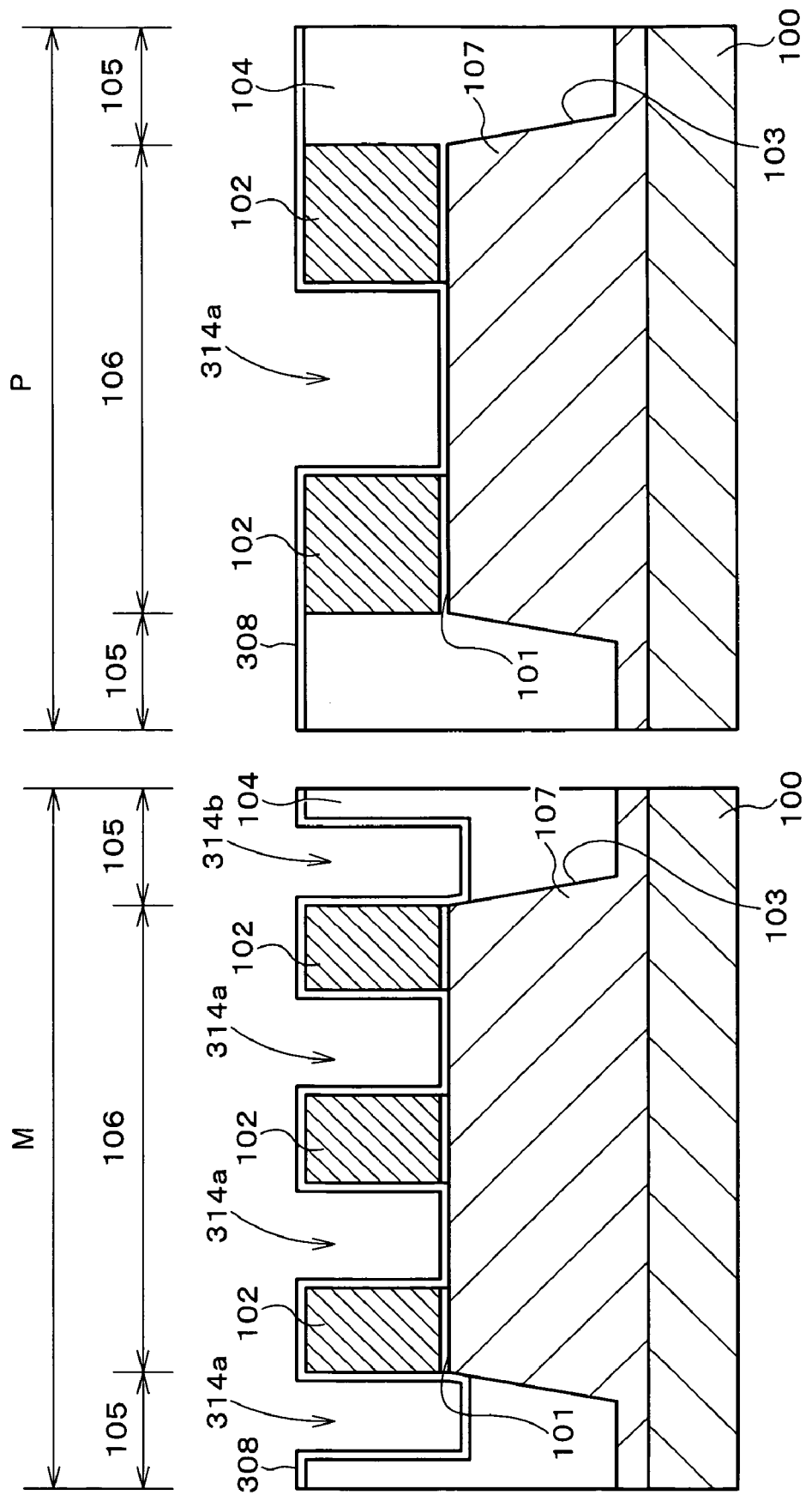
FIG. 27 is a partial cross-sectional diagram showing one process (a formation of a gate trench 314c to a formation of a silicon oxide film 308) of the method of manufacturing a semiconductor device according to a third embodiment of the present invention.

After carrying out the processing according to the first embodiment shown in FIG. 1 and FIG. 2, the silicon nitride film 102 and the silicon oxide film 104 that are present in the region 114a (see FIG. 2) in which a gate electrode is to be formed are removed, thereby forming a gate trench 314a as shown in FIG. 27.

Figure 28:
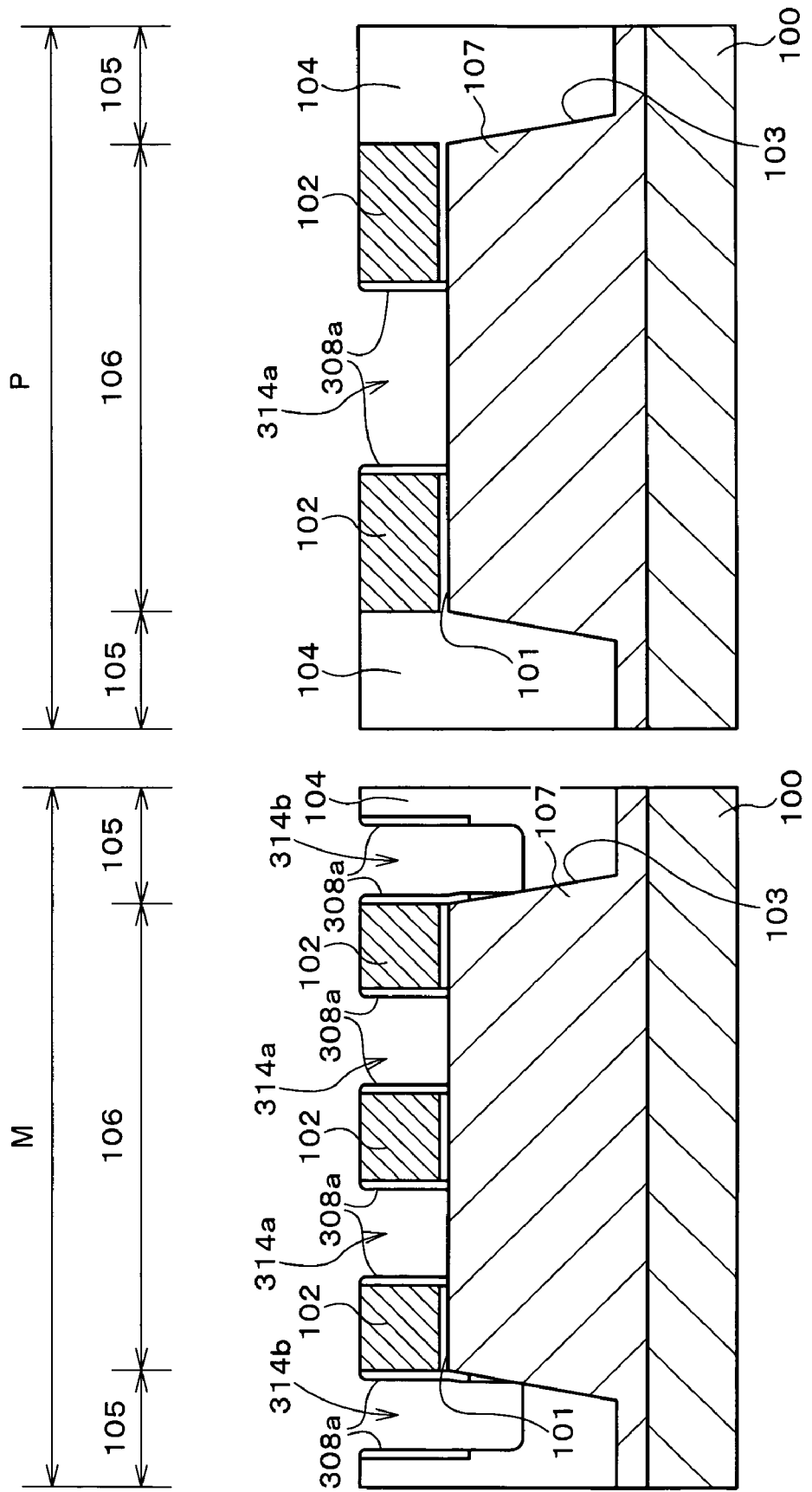
FIG. 28 is a partial cross-sectional diagram showing one process (a formation of a sidewall 308a to a formation of a gate trench 314b) of the method of manufacturing a semiconductor device according to a third embodiment of the present invention.

Next, the mask pattern is removed, and a silicon oxide film 308 is formed in the film thickness of about 10 to 20 nm on the whole surface by LPCVD. The silicon oxide film 308 is then etched back as shown in FIG. 28, thereby forming a sidewall 308a. In this case, by sufficiently performing the over-etching, the gate trench 314a formed on the silicon oxide film 104 in the isolation region 105 can be further etched, thereby forming a deeper gate trench 314b. By performing this over-etching, the film thickness of the silicon nitride film 102 can be reduced substantially. Therefore, in the third embodiment, the film thickness of the silicon nitride film 102 needs to be set sufficiently large in advance.

Figure 29:
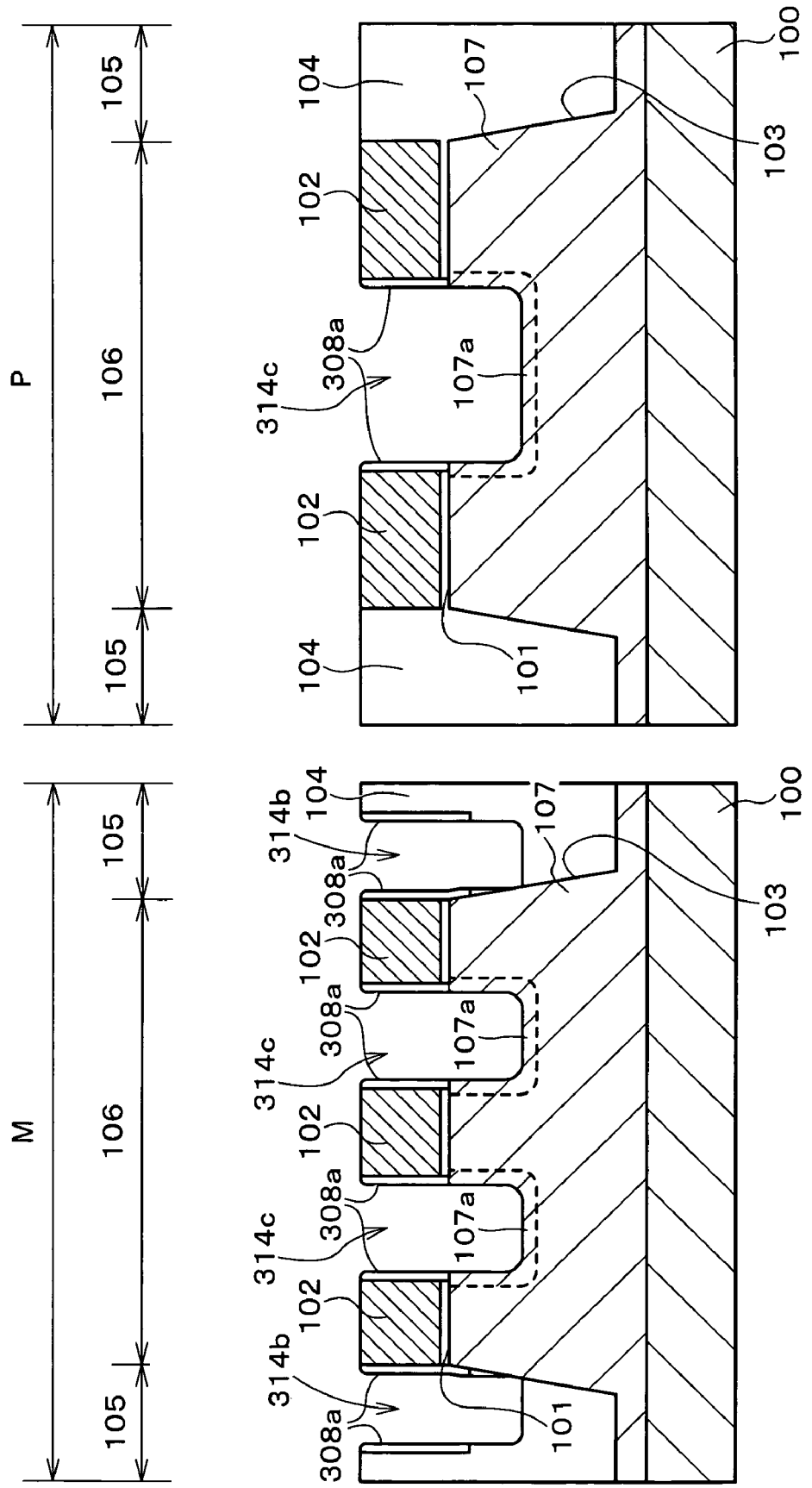
FIG. 29 is a partial cross-sectional diagram showing one process (a formation of a gate trench 314c) of the method of manufacturing a semiconductor device according to a third embodiment of the present invention.

Furthermore, as shown in FIG. 29, the semiconductor substrate 100 (the p-type well layer 107) is etched by using the silicon nitride film 102 and the sidewall 308a as masks, thereby further etching the gate trench 314a formed on the semiconductor substrate 100 (the p-well layer 107) in the active region 106 and forming a deep gate trench 314c. Preferably, the depth of the gate trench 314c formed in the active region 106 is set substantially equal to the depth of the gate trench 314b formed in the isolation region 105. Thereafter, the channel region 107a is channel-doped according to need.

The subsequent process is similar to that according to the second embodiment. After the gate insulation film 110 is formed on the surface of the gate trench 314c, gate electrodes are buried into the gate trenches 314b and 314c (see FIG. 25). After the cap 115a and the contact hole 120a are formed (see FIG. 8 and FIG. 9), the source/drain diffusion regions 116 and the LDD regions 109 are formed (see FIG. 10). Furthermore, the contact hole 120 is formed (see FIG. 18). After the bit line 121 and the memory cell capacitor 122 are formed (see FIG.

20), wiring layers are formed on them by a required number. A semiconductor device according to the third embodiment is thus completed.

It is also important that both the insulation material that constitutes the cap 115a and the insulation material that constitutes the sidewall 308a are "silicon oxide". With this arrangement, the contact plug 120 can be formed in self alignment in the active region 106.

As described above, because the sidewall 308a is used in the third embodiment, effects similar to those according to the second embodiment can be obtained. Because the gate trench 314b is formed in the element isolation region 105 by overetching at the time of forming the sidewall and thereafter the gate trench 314c is formed in the active region 106, a large gap does not occur at the boundary between the isolation region 105 and the active region 106 during the processing. Consequently, a sidewall that remains in the standoff state at the boundary does not need to be removed, unlike the second embodiment.

The present invention is in no way limited to the aforementioned embodiments, but rather various modifications are possible within the scope of the invention as recited in the claims, and naturally these modifications are included within the scope of the invention.

While the present invention is applied to a DRAM in the above embodiments, the application field is not limited to this. The present invention can be also applied to other semiconductor memories and processors, and various semiconductor devices such as DRAM-mounted processors.

While the element isolation region 105 has the STI configuration in the above embodiments, the element isolation region 105 can be also formed by local oxidation of silicon (LOCOS). When the element isolation region 105 has the STI configuration in the above embodiments, the silicon oxide film 104 in the element isolation region 105 can be made substantially flat. Therefore, the gate trench can be formed more easily.

While the gate electrode 114 is structured by the laminate of the polycrystalline silicon film 111, the tungsten nitride film 112, and the tungsten film 113 in the above embodiments, there is no particular limit to the structure and materials of the gate electrode. Therefore, the gate electrode 114 can have a single-layer structure including only a polycrystalline silicon film. Similarly, while the contact flag 120 is structured by the laminate of the titanium film 117, the titanium nitride film 118, and the blanket tungsten film 119 in the above embodiments, there is no particular limit to the structure and materials of the contact flag.

As explained above, according to the present invention, a diffusion layer contact pattern is not necessary. Therefore, the number of steps of the photolithography process can be reduced, and integration can be increased based on a reduction in the active region. Furthermore, because the aspect ratio of a gate trench and a contact hole can be reduced, various kinds of materials constituting the gate electrode and various kinds of materials constituting the contact plug can be buried easily. Because the gate electrode is buried in the gate trench thereby increasing the gate length, a sub-threshold current due to the short-channel effect can be decreased.

Therefore, the present invention can be applied particularly effectively to a semiconductor device in which a high integration of a DRAM is required and a cost reduction of which is strongly required. When the present invention is applied to a DRAM, the refresh characteristic can be also improved by reducing the sub-threshold current.

What is claimed is:

1. A semiconductor device, comprising:
    an active region that is surrounded by an isolation region, the active region having source/drain diffusion regions and a gate trench formed between the source/drain diffusion regions;
    a gate electrode at least a part of which is buried in the gate trench; and contact plugs connected to the source/drain diffusion regions, wherein the isolation region and the gate trench are arranged along a first direction,
    a periphery of the contact plugs at an isolation region side extends from a boundary between the isolation region and the active region in a second direction crossing the first direction so as to be aligned with the boundary, and
    another periphery of the contact plugs at a side opposed to the isolation region side extends from an opening edge of the gate trench in the second direction so as to be aligned with an inner surface of the gate trench;
    a cap provided on the gate electrode, wherein an upper surface of the contact plugs and an upper surface of the cap are coplanar.

2. The semiconductor device as claimed in claim 1, wherein said gate electrode includes a first conductive film provided on a surface of the gate trench and a second conductive film provided at the center of the gate trench, and an end surface of the first conductive film is positioned lower than a main surface of the semiconductor substrate.

3. The semiconductor device as claimed in claim 2, wherein an end surface of the second conductive film is positioned lower than an upper surface of the contact plug.

4. The semiconductor device as claimed in claim 1, wherein said cap has a part provided between the gate electrode and the contact plug.

5. The semiconductor device as claimed in claim 1, further comprising a sidewall that covers a side surface of the gate electrode, wherein
    the sidewall and the cap are made of the same dielectric material as each other.

6. The semiconductor device as claimed in claim 1, wherein said isolation region has a structure that a dielectric material is buried in an isolation trench.

7. A semiconductor device comprising at least a memory cell region and a peripheral circuit region, wherein each of the memory cell region and the peripheral circuit region includes:
    an active regions that is surrounded by an isolation region having source/drain diffusion regions and a gate trench formed between the source/drain diffusion regions;
    a gate electrode at least a part of which is buried in the gate trench; and contact plugs connected to the source/drain diffusion regions, wherein the isolation region and the gate trench are arranged along a first direction,
    a periphery of the contact plugs at an isolation region side extends from a boundary between the isolation region and the active region in a second direction crossing the first direction so as to be aligned with the boundary, and
    another periphery of the contact plugs at a side opposed to the isolation region side extends from an opening edge of the Rate trench in the second direction so as to be aligned with an inner surface of the gate trench.
    a cap provided on the gate electrode, wherein an upper surface of the contact plugs and an upper surface of the cap are coplanar.

8. A semiconductor device comprising:
    an active region surrounded by an isolation region that comprises an insulating film, the active region including a first region serving as one of source and drain regions and a second region serving as the other of the source and drain regions;

a gate trench formed in the active region between the first and second regions;

a gate electrode having a portion formed in the gate trench with an intervention of a gate insulating film; and first and second contact plugs provided respectively for the first and second regions;

each of the first and second regions having an upper surface which has a first peripheral edge portion defined by the isolation region and a second peripheral edge portion defined by the gate trench, and each of the first and second contact plugs having a lower surface that is contact with the upper surface of an associated one of the first and second regions, and the lower surface of each of the first and second contact plugs having a third peripheral edge portion that is substantially aligned with the first peripheral edge portion of the upper surface of an associated one of the first and second regions and a fourth peripheral edge portion that is substantially aligned with the second peripheral edge portion of the associated one of the first and second regions; and a cap provided on the pate electrode, wherein an upper surface of the contact plugs and an upper surface of the cap are coplanar.

9. The semiconductor device as claimed in claim 8, wherein the active region further includes a third region serving as one of another source region and another drain region and the device further comprises an additional gate trench formed in the active region between the first and third regions and a third contact plug provided for the third region, the third region having an upper surface which has a fifth peripheral edge portion defined by the isolation region and a sixth peripheral edge portion defined by the additional gate trench, the third contact plugs having a lower surface that is contact with the upper surface of the third region, and the lower surface of the third contact plug having a seventh peripheral edge portion that is substantially aligned with the fifth peripheral edge portion of the upper surface of the third region and an eighth peripheral edge portion that is substantially aligned with the sixth peripheral edge portion of the third region.

10. The semiconductor device as claimed in claim 8, wherein said gate electrode includes a first conductive film provided on a surface of the gate trench and a second conductive film provided at the center of the gate trench, and an end surface of the first conductive film is positioned lower than a main surface of the semiconductor substrate.

11. The semiconductor device as claimed in claim 10, wherein an end surface of the second conductive film is positioned lower than an upper surface of the contact plug.

12. The semiconductor device as claimed in claim 8, wherein said cap has a part provided between the gate electrode and the contact plug.

13. The semiconductor device as claimed in claim 8, further comprising a sidewall that covers a side surface of the gate electrode, wherein the sidewall and the cap are made of the same dielectric material as each other.

14. The semiconductor device as claimed in claim 8, wherein said isolation region has a structure that a dielectric material is buried in an isolation trench.

* * * * *